United States Patent
Yamamoto

(10) Patent No.: US 9,192,051 B2
(45) Date of Patent: Nov. 17, 2015

(54) MODULE SUBSTRATE, MODULE-SUBSTRATE MANUFACTURING METHOD, AND TERMINAL CONNECTION SUBSTRATE

(75) Inventor: Issei Yamamoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 238 days.

(21) Appl. No.: 13/597,811

(22) Filed: Aug. 29, 2012

(65) Prior Publication Data

US 2012/0320536 A1  Dec. 20, 2012

Related U.S. Application Data

(63) Continuation of application No. PCT/JP2011/055028, filed on Mar. 4, 2011.

(30) Foreign Application Priority Data

Apr. 13, 2010 (JP) ................................ 2010-091913
Apr. 30, 2010 (JP) ................................ 2010-104791

(51) Int. Cl.
  *H05K 7/06* (2006.01)
  *H05K 1/18* (2006.01)
  (Continued)

(52) U.S. Cl.
  CPC ............ *H05K 1/186* (2013.01); *H01L 21/561* (2013.01); *H01L 23/49805* (2013.01); *H01L 23/49811* (2013.01); *H01L 24/97* (2013.01);
  (Continued)

(58) Field of Classification Search
  CPC ............. H05K 7/06; H05K 3/30; H05K 1/00

USPC ......... 361/760, 728, 734, 763–767; 174/255, 174/260, 261; 257/688–689
See application file for complete search history.

(56) References Cited

U.S. PATENT DOCUMENTS 6,625,036 B1 * 9/2003 Horio .......................... 361/760
6,628,527 B2 * 9/2003 Muramatsu et al. .......... 361/768
(Continued)

FOREIGN PATENT DOCUMENTS

CN  101268550 A  9/2008
JP  03-236265 A  10/1991
(Continued)

OTHER PUBLICATIONS

Official Communication issued in International Patent Application No. PCT/JP2011/055028, mailed on May 24, 2011.
(Continued)

*Primary Examiner* — Jenny L Wagner
*Assistant Examiner* — Michael P McFadden
(74) *Attorney, Agent, or Firm* — Keating & Bennett, LLP

(57) ABSTRACT

In a module substrate, a plurality of terminal connection substrates each including an insulator and a plurality of columnar terminal electrodes arranged on a single lateral surface or both lateral surfaces of the insulator is mounted on a single side of a composite substrate such that at least one of the terminal connection substrates extends over a border between a plurality of neighboring module substrates. The composite substrate, in which the plurality of terminal connection substrates is mounted on the single side and a plurality of electronic components is mounted on at least the single side, is divided at a location where the module substrates are to be cut from the composite substrate.

5 Claims, 19 Drawing Sheets

(51) Int. Cl.
*H01L 21/56* (2006.01)
*H01L 23/498* (2006.01)
*H01L 25/065* (2006.01)
*H05K 3/40* (2006.01)
*H01L 23/31* (2006.01)
*H01L 23/00* (2006.01)
*H05K 3/00* (2006.01)
*H01L 25/16* (2006.01)

(52) U.S. Cl.
CPC .......... *H01L25/0655* (2013.01); *H05K 3/4007* (2013.01); *H01L 23/3107* (2013.01); *H01L 23/49833* (2013.01); *H01L 24/16* (2013.01); *H01L 25/165* (2013.01); *H01L 2224/16* (2013.01); *H01L 2224/16225* (2013.01); *H01L 2224/16227* (2013.01); *H01L 2224/45147* (2013.01); *H01L 2224/97* (2013.01); *H01L 2924/00014* (2013.01); *H01L 2924/01004* (2013.01); *H01L 2924/014* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01078* (2013.01); *H01L 2924/01079* (2013.01); *H01L 2924/01082* (2013.01); *H01L 2924/09701* (2013.01); *H01L 2924/15313* (2013.01); *H01L 2924/19105* (2013.01); *H01L 2924/19106* (2013.01); *H05K 3/0052* (2013.01); *Y10T 29/4913* (2015.01)

(56) References Cited

U.S. PATENT DOCUMENTS

| | | | |
|---|---|---|---|
| 7,405,471 B2 * | 7/2008 | Kledzik et al. | 257/686 |
| 2003/0184985 A1 * | 10/2003 | Oshima et al. | 361/760 |
| 2008/0278920 A1 | 11/2008 | Mizuhara et al. | |

FOREIGN PATENT DOCUMENTS

| | | |
|---|---|---|
| JP | 06-216314 A | 8/1994 |
| JP | 2001-156222 A | 6/2001 |
| JP | 2004-172422 A | 6/2004 |
| JP | 2004-303944 A | 10/2004 |
| JP | 2007-103553 A | 4/2007 |
| JP | 3960479 B1 | 8/2007 |
| JP | 2009-123869 A | 6/2009 |

OTHER PUBLICATIONS

Official Communication issued in corresponding Chinese Patent Application No. 201180013761.5, mailed on Aug. 4, 2014.

* cited by examiner

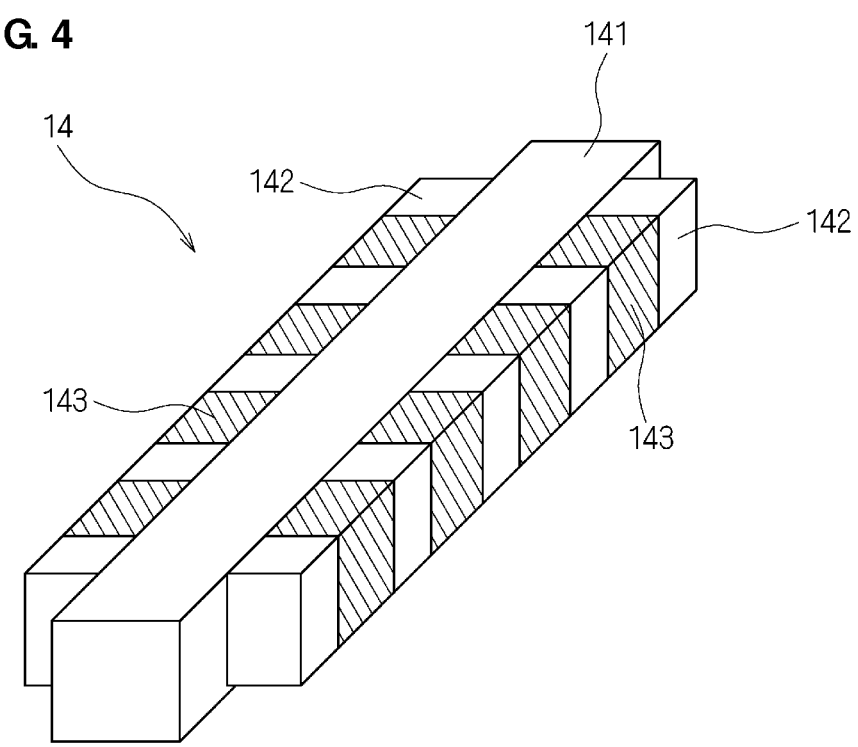

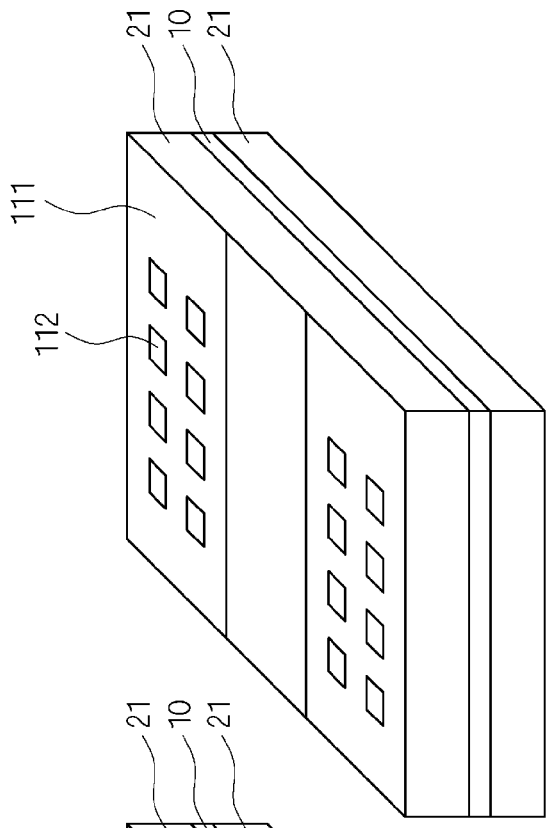
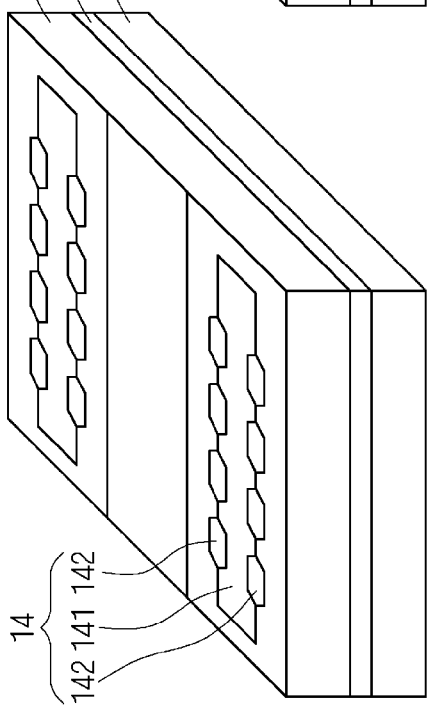

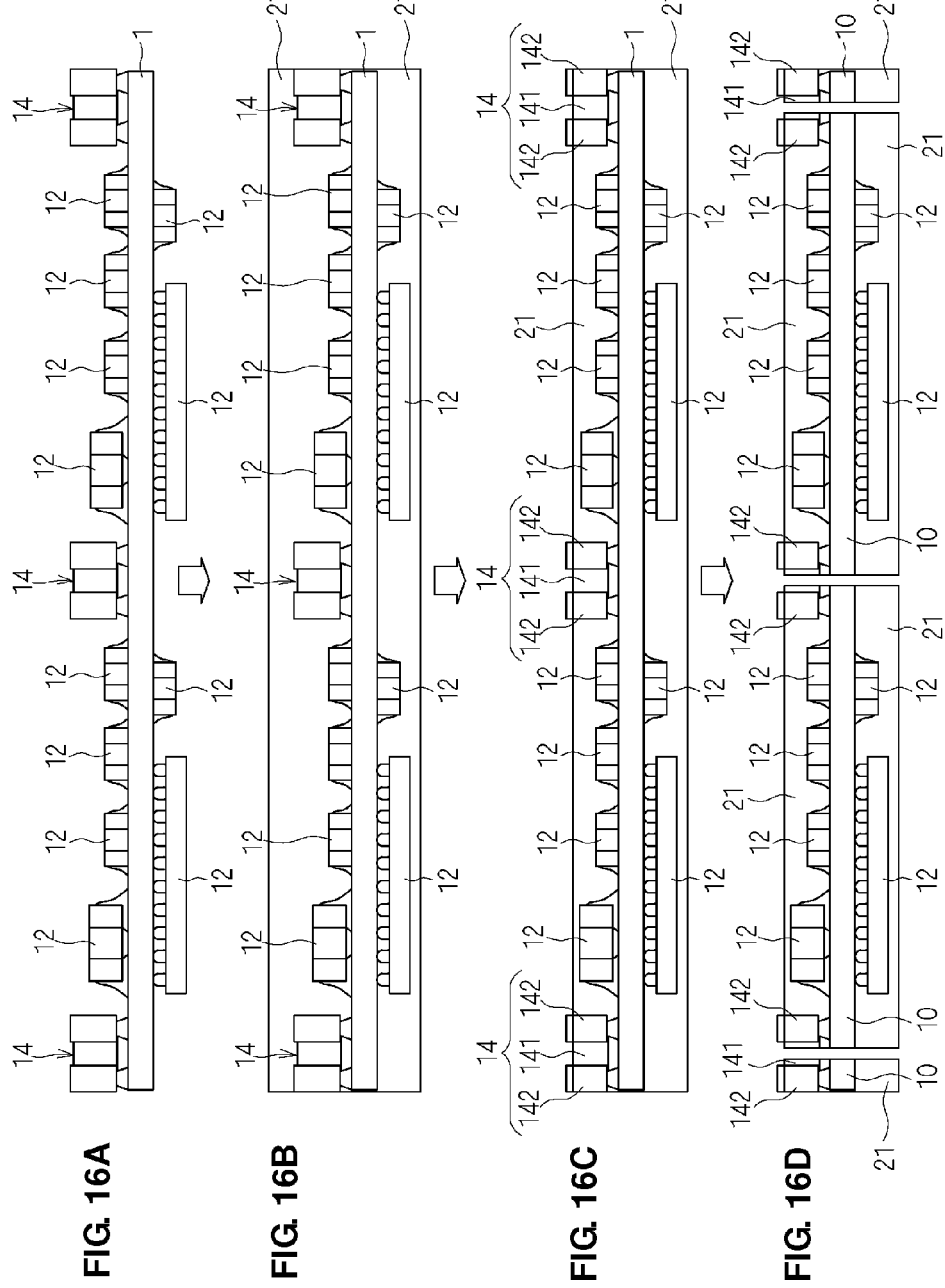

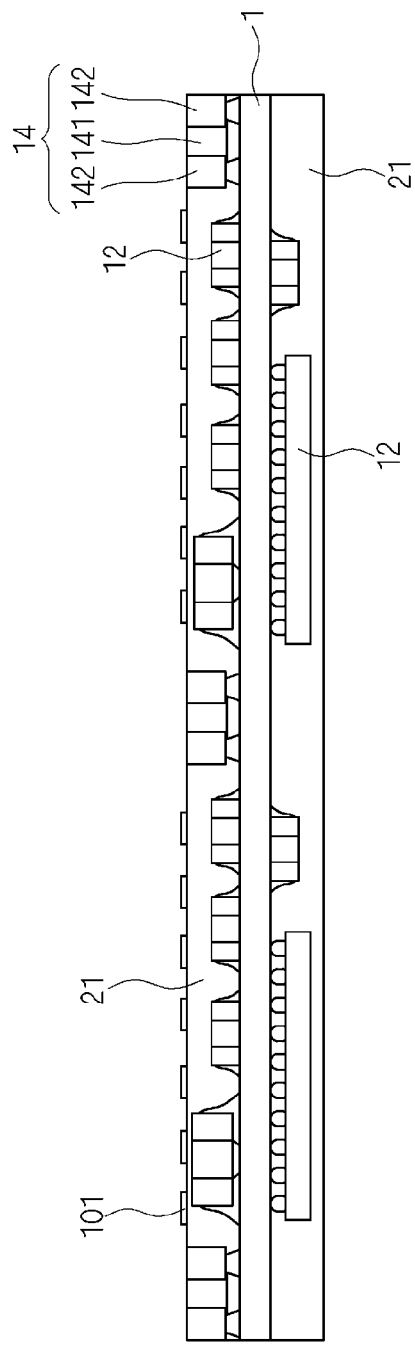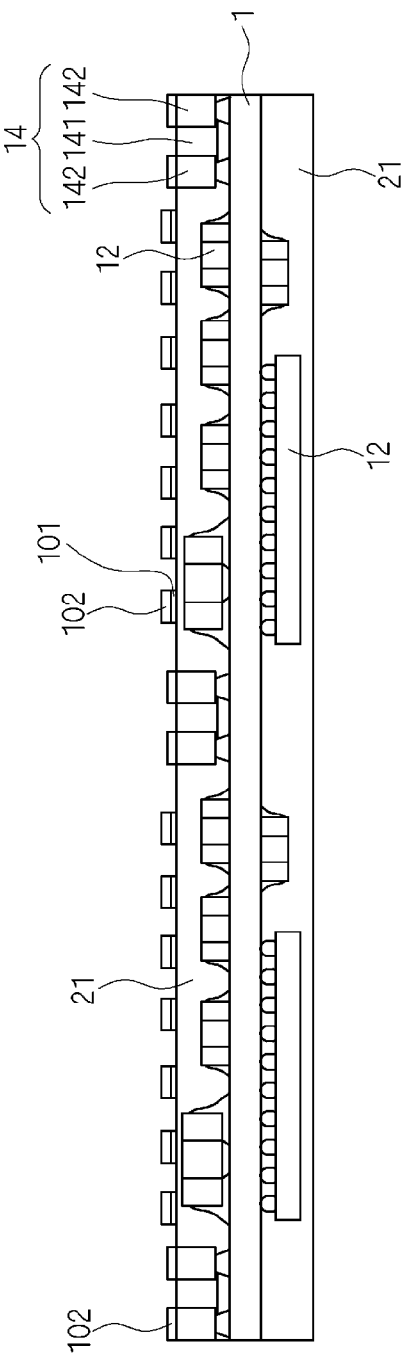

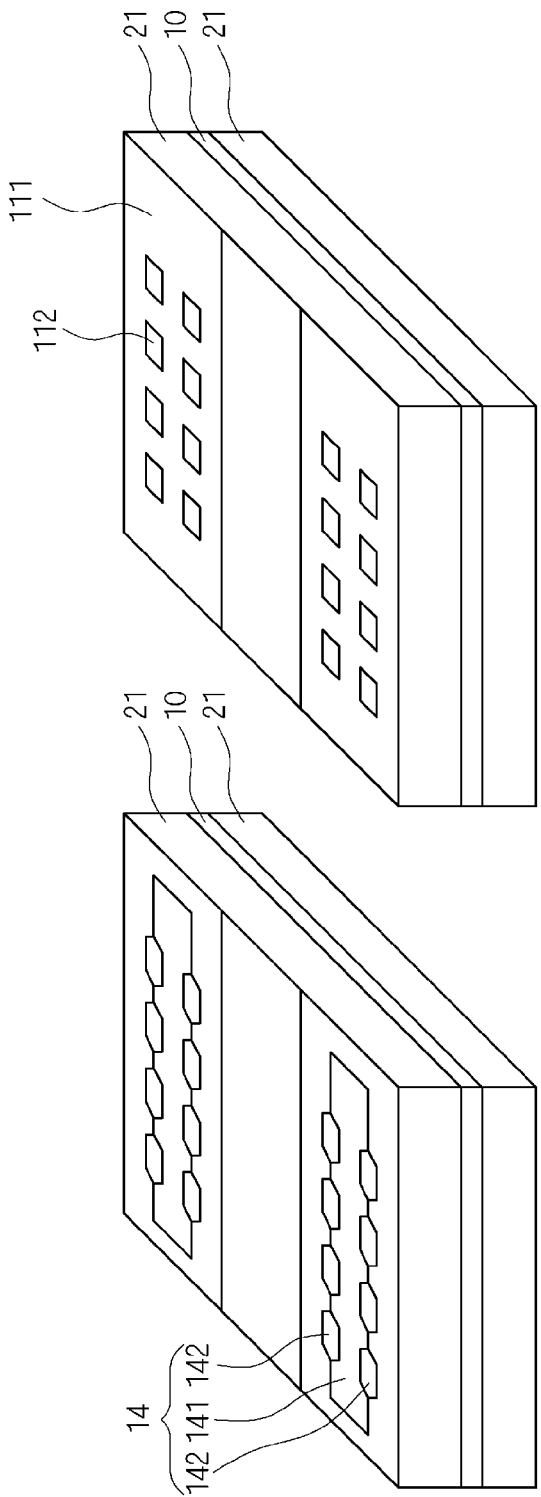

MODULE SUBSTRATE, MODULE-SUBSTRATE MANUFACTURING METHOD, AND TERMINAL CONNECTION SUBSTRATE

BACKGROUND OF THE INVENTION

1. Field of the Invention

The present invention relates to a module substrate obtained by dividing a composite substrate including a plurality of electronic components mounted on a single side or both sides thereof and cutting the module substrates from the composite substrate, a module-substrate manufacturing method of cutting a plurality of module substrates from a composite substrate, and a terminal connection substrate.

2. Description of the Related Art

With size and weight reduction of an electronic device in recent years, a module substrate mounted on the electronic device itself also needs to reduce its size and weight. Therefore, electronic components are mounted on both sides of the module substrate using a lead terminal, a solder ball, a cavity structure, or the like to reduce the size and weight.

Japanese Patent No. 3960479 discloses a method of manufacturing a semiconductor apparatus having an inexpensive double-sided electrode structure without forming a cavity structure or the like. That is, a plurality of connection electrodes integrated by a coupling plate is fixed on a module substrate on which electronic components are mounted, then the coupling plate is removed by grinding to form the plurality of connection electrodes on the module substrate. Thus, even if the coupling plate is inclined because the plurality of connection electrodes is fixed on the module substrate, for example, by soldering or the like, coplanarity of the module substrate can be obtained by grinding the coupling plate until the inclined state is eliminated.

Japanese Unexamined Patent Application Publication No. 2009-123869 discloses a module in which a spacer substrate (connection substrate) including an electrode formed using a through hole is arranged. In the module disclosed in Japanese Unexamined Patent Application Publication No. 2009-123869, lands of the spacer substrate are electrically connected using the through hole. Thus, reliability of electrical connection between the module and an external substrate can be maintained high.

However, the method of manufacturing a semiconductor apparatus disclosed in Japanese Patent No. 3960479 requires the step of removing the coupling plate by grinding it and thus involves a grinding step. Accordingly, there is a problem in that it is difficult to reduce the manufacturing cost. In addition, if the coupling plate was not able to be sufficiently ground, poor connections may occur in the connection electrodes.

Moreover, because the length of the section of each of the connection electrodes exposed from the coupling plate is relatively long, the connection electrode may be deformed depending on its handling in a taping step or the like before fixation on the module substrate. Thus, neighboring connection electrodes may be short-circuited.

In the module disclosed in Japanese Unexamined Patent Application Publication No. 2009-123869, because it uses a through hole and thus the end surface electrode is formed of a thin plating film, there is a problem in that it is impossible to pass a large current. In addition, a complicated step, such as forming the through hole and forming the plating film, is needed.

SUMMARY OF THE INVENTION

In light of such circumstances, preferred embodiments of the present invention provide a module substrate that can be obtained using simple manufacturing steps and that includes terminal electrodes reliably connectable without being short-circuited, a module-substrate manufacturing method, and a terminal connection substrate.

A module substrate according to a first preferred embodiment of the present invention includes a base substrate and a plurality of electronic components mounted on at least a single side of the base substrate. The module substrate includes a plurality of terminal connection substrates each including an insulator and a plurality of columnar terminal electrodes arranged on at least a single lateral surface of the insulator. The plurality of terminal connection substrates is mounted on the base substrate such that a single end side of each of the plurality of columnar terminal electrodes is in contact with the base substrate.

In the first preferred embodiment of the present invention, the plurality of terminal connection substrates each including the insulator and the plurality of columnar terminal electrodes arranged on at least the single lateral surface of the insulator is included, and the plurality of terminal connection substrates is mounted on the base substrate such that the single end side of each of the plurality of columnar terminal electrodes is in contact with the base substrate. Therefore, electrical connection can be made using not a thin plating film formed in a through hole but the columnar terminal electrodes, and a relatively large current can be passed. A complicated step, such as forming a through hole and forming a plating film, is not necessary, the manufacturing steps can be simplified, and the manufacturing cost as a whole can be reduced.

For the module substrate according to a second preferred embodiment of the present invention, the plurality of columnar terminal electrodes of each of the terminal connection substrates may preferably be arranged on both lateral surfaces of the insulator.

In the second preferred embodiment of the present invention, the plurality of terminal connection substrates each including the insulator and the plurality of columnar terminal electrodes arranged on both lateral surfaces of the insulator is included, and the plurality of terminal connection substrates is mounted on the base substrate such that the single end side of each of the plurality of columnar terminal electrodes is in contact with the base substrate. Therefore, electrical connection can be made using not a thin plating film formed in a through hole but the columnar terminal electrodes, and a relatively large current can be passed. A complicated step, such as forming a through hole and forming a plating film, is not necessary, the manufacturing steps can be simplified, and the manufacturing cost as a whole can be reduced.

For the module substrate according to a third preferred embodiment of the present invention, the plurality of terminal electrodes of the terminal connection substrate may be arranged in a line on each of both lateral surfaces of the insulator.

In the third preferred embodiment of the present invention, the plurality of terminal electrodes of the terminal connection substrate is arranged in a line on each of both lateral surfaces of the insulator. Thus, the single terminal connection substrate can include two lines of the terminal electrodes.

For the module substrate according to a fourth preferred embodiment of the present invention, a resist may be provided between the plurality of terminal electrodes in the terminal connection substrate.

In the fourth preferred embodiment of the present invention, the resist is preferably printed between the plurality of terminal electrodes in the terminal connection substrate. Thus, a burr, elongation, and the like that will easily occur in dividing a composite substrate into a plurality of module substrates can be prevented, and deformation of the terminal electrodes can be prevented.

For the module substrate according to a fifth preferred embodiment of the present invention, the plurality of electronic components and the plurality of terminal connection substrates mounted on the base substrate may be sealed with resin, and the resin may have an identical composition to that of the insulator.

In the fifth preferred embodiment of the present invention, the plurality of electronic components and the plurality of terminal connection substrates mounted on the base substrate are preferably sealed with the resin. Thus, resistance to impacts occurring when the module substrate drops is improved, and reliability as the module substrate is improved. In addition, the resin preferably has the identical composition to that of the insulator. Thus, adhesion between the sealing resin and the insulator is increased, the resistance to impacts occurring when the module substrate drops is further improved, and the reliability as the module substrate is further improved.

A module-substrate manufacturing method according to a sixth preferred embodiment of the present invention is a method of dividing a composite substrate including a plurality of electronic components mounted on at least a single side thereof and cutting a plurality of module substrates from the composite substrate. The module-substrate manufacturing method includes a first step of mounting a plurality of terminal connection substrates each including an insulator and a plurality of columnar terminal electrodes mounted on both lateral surfaces of the insulator on a single side of the composite substrate such that at least one of the terminal connection substrates extends over a border between the plurality of neighboring module substrates and a second step of dividing the composite substrate, on which the plurality of terminal connection substrates and the plurality of electronic components are mounted, in a position where the module substrates are to be cut from the composite substrate.

In the sixth preferred embodiment of the present invention, the plurality of terminal connection substrates each including the insulator and the plurality of columnar terminal electrodes mounted on both lateral surfaces of the insulator is mounted such that at least one of the terminal connection substrates extends over the border between the plurality of neighboring module substrates. The composite substrate, on which the plurality of terminal connection substrates and the plurality of electronic components are mounted, is divided in the position where the module substrates are to be cut from the composite substrate. Therefore, because a coupling plate by which a plurality of terminal electrodes is integrated does not exist, a step of grinding the coupling plate is not necessary, and a via-hole forming step of forming a via-hole for each of terminal electrodes is not necessary, either, and the manufacturing steps can be simplified. Thus, the manufacturing cost as a whole can be greatly reduced. In addition, the end of each of the terminal electrodes can be reliably exposed to the outside, and there is no possibility that poor connection occurs. Moreover, because the height of the exposed section of the terminal electrode is relatively small, the terminal electrode is not easily deformable and the reliable connection of terminal electrodes can be performed without being short-circuited with each other.

For the module-substrate manufacturing method according to a seventh preferred embodiment of the present invention, each of the module substrates may have a rectangular or substantially rectangular external shape in plan view, and, in the first step, the terminal connection substrates may be arranged on two opposite sides of outer sides of the module substrate.

In the seventh preferred embodiment of the present invention, each of the module substrates preferably has the rectangular or substantially rectangular external shape in plan view and the terminal connection substrates are arranged on the two opposite sides of the outer sides of the module substrate. Thus, the number of man-hours for mounting the terminal connection substrates on the composite substrate can be reduced and the manufacturing cost can be reduced.

For the module-substrate manufacturing method according to an eighth preferred embodiment of the present invention, each of the module substrates may have a rectangular or substantially rectangular external shape in plan view, and, in the first step, the terminal connection substrates may be arranged on four outer sides of the module substrate.

In the eighth preferred embodiment of the present invention, each of the module substrates preferably has the rectangular or substantially rectangular external shape in plan view and the terminal connection substrates are arranged on the four outer sides of the module substrate. Thus, the module substrate including a larger number of the terminal electrodes connectable to an external device can be manufactured.

For the module-substrate manufacturing method according to a ninth preferred embodiment of the present invention, the plurality of terminal electrodes of the terminal connection substrate may be arranged in a line on each of both lateral surfaces of the insulator.

In the ninth preferred embodiment of the present invention, the plurality of terminal electrodes of the terminal connection substrate is preferably arranged in a line on each of both lateral surfaces of the insulator. Thus, the single terminal connection substrate can include two lines of the terminal electrodes for two module-substrates.

For the module-substrate manufacturing method according to a tenth preferred embodiment of the present invention, a resist may be provided between the plurality of terminal electrodes in the terminal connection substrate.

In the tenth preferred embodiment of the present invention, the resist may preferably be printed between the plurality of terminal electrodes in the terminal connection substrate. Thus, a burr, elongation, and the like that will easily occur in dividing the composite substrate into the plurality of module substrates can be prevented, and deformation of the terminal electrodes can be prevented.

For the module-substrate manufacturing method according to an eleventh preferred embodiment of the present invention, in the second step, the insulator of the terminal connection substrate may be fully removed in dividing the composite substrate.

In the eleventh preferred embodiment of the present invention, the insulator of the terminal connection substrate preferably is fully removed in dividing the composite substrate. Thus, the terminal electrode can be formed as a peripheral electrode exposed on a periphery of the module substrate.

For the module-substrate manufacturing method according to a twelfth preferred embodiment of the present invention, in the second step, the insulator of the terminal connection substrate may remain in dividing the composite substrate.

In the twelfth preferred embodiment of the present invention, the insulator of the terminal connection substrate preferably remains in dividing the composite substrate. Thus, the terminal electrode is not exposed on a periphery of the module substrate, and surface processing, such as plating on the exposed section, is not necessary. Accordingly, the manufacturing cost can be reduced.

The module-substrate manufacturing method according to a thirteenth preferred embodiment of the present invention may further include a step of, after the first step, sealing the plurality of electronic components and the plurality of terminal connection substrates mounted on the composite substrate with resin and grinding a top surface of the sealing resin.

In the thirteenth preferred embodiment of the present invention, the plurality of electronic components and the plurality of terminal connection substrates mounted on the composite substrate are sealed with resin, and the top surface of the sealing resin is ground. Sealing and fixing the surrounding areas of the terminal electrodes with the resin improves the resistance to impacts occurring when the module substrate drops and improves the reliability as the module substrate.

The module-substrate manufacturing method according to a fourteenth preferred embodiment of the present invention may further include a step of, after the step of grinding the top surface of the sealing resin, forming an NC electrode using conductive paste.

In the fourteenth preferred embodiment of the present invention, after the step of grinding the top surface of the sealing resin, the NC electrode is preferably formed using the conductive paste. Thus, the number of electrodes connected to the mother substrate can be easily increased, and impacts occurring in a drop can be easily dispersed.

The module-substrate manufacturing method according to a fifteenth preferred embodiment of the present invention may further include a step of performing rewiring on the top surface of the sealing resin.

In the fifteenth preferred embodiment of the present invention, the rewiring is performed on the top surface of the sealing resin. Thus, the locations of external electrodes are not limited to the locations of the terminal electrodes (the neighborhood of an outer side of the module substrate), and the flexibility in design is improved.

The module-substrate manufacturing method according to a sixteenth preferred embodiment of the present invention may further include a step of performing resist printing.

In the sixteenth preferred embodiment of the present invention, printing the resist preferably can cover the outer edge of the terminal electrode. Thus, entry of moisture from the top surface or the like can be prevented.

For the module-substrate manufacturing method according to a seventeenth preferred embodiment of the present invention, the sealing resin may have an identical composition to that of the insulator of the terminal connection substrate.

In the seventeenth preferred embodiment of the present invention, the sealing resin preferably has the identical composition to that of the insulator of the terminal connection substrate. Thus, the adhesion between the sealing resin and the insulator is increased, the resistance to impacts occurring when the module substrate drops is improved, and the reliability as the module substrate is improved.

A terminal connection substrate according to an eighteenth preferred embodiment of the present invention includes a plurality of columnar terminal electrodes arranged on at least a single lateral surface of an insulator.

In the eighteenth preferred embodiment of the present invention, mounting the terminal connection substrate in which the plurality of columnar terminal electrodes is arranged on at least the single lateral surface of the insulator such that a single end side of each of the plurality of columnar terminal electrodes is in contact with a base substrate enables electrical connection using not a thin plating film formed in a through hole but the columnar terminal electrodes and thus enables a relatively large current to pass.

For the terminal connection substrate according to a nineteenth preferred embodiment of the present invention, the plurality of columnar terminal electrodes may be arranged on both lateral surfaces of the insulator.

In the nineteenth preferred embodiment of the present invention, mounting the terminal connection substrate in which the plurality of columnar terminal electrodes is arranged on both lateral surfaces of the insulator such that a single end side of each of the plurality of columnar terminal electrodes is in contact with a base substrate enables electrical connection using not a thin plating film formed in a through hole but the columnar terminal electrodes and thus enables a relatively large current to pass.

With the above configuration, electrical connection can be made using not a thin plating film formed in a through hole but the columnar terminal electrodes, and thus a relatively large current can be passed. A complicated step, such as forming a through hole and forming a plating film, is not necessary, the manufacturing steps can be simplified, and thus the manufacturing cost as a whole can be reduced.

With the above configuration, because a coupling plate by which a plurality of terminal electrodes is integrated does not exist, a step of grinding the coupling plate is not necessary, and a via-hole forming step of forming a via-hole for each of terminal electrodes is not necessary, either, and the manufacturing cost as a whole can be greatly reduced. In addition, the end of each of the terminal electrodes can be reliably exposed to the outside, and there is no possibility that poor connection occurs. Moreover, because the height of the exposed section of the terminal electrode is relatively small, the terminal electrode is not easily deformable and the reliable connection of terminal electrodes can be performed without being short-circuited with each other.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a perspective view that illustrates a configuration of the terminal connection substrate including resists printed between terminal electrodes and arranged in the module substrate according to the first preferred embodiment of the present invention.

FIGS. 9A and 9B include perspective views that illustrate steps in performing resist printing on the module substrate according to the second preferred embodiment of the present invention.

FIGS. 16A-16D include cross-sectional views that illustrate steps of manufacturing the module substrate according to a fourth preferred embodiment of the present invention in a plane orthogonal to the direction in which the terminal connection substrates are arranged.

FIGS. 17A and 17B include cross-sectional views that illustrate steps in forming NC electrodes in the module substrate according to the fourth preferred embodiment of the present invention in a plane orthogonal to the direction in which the terminal connection substrates are arranged.

FIGS. 18A and 18B include perspective views that illustrate steps in performing resist printing on the module substrate according to the fourth preferred embodiment of the present invention.

DETAILED DESCRIPTION OF THE PREFERRED EMBODIMENTS

Preferred embodiments of the present invention are described in detail below with reference to the drawings.

First Preferred Embodiment

Figure 1:
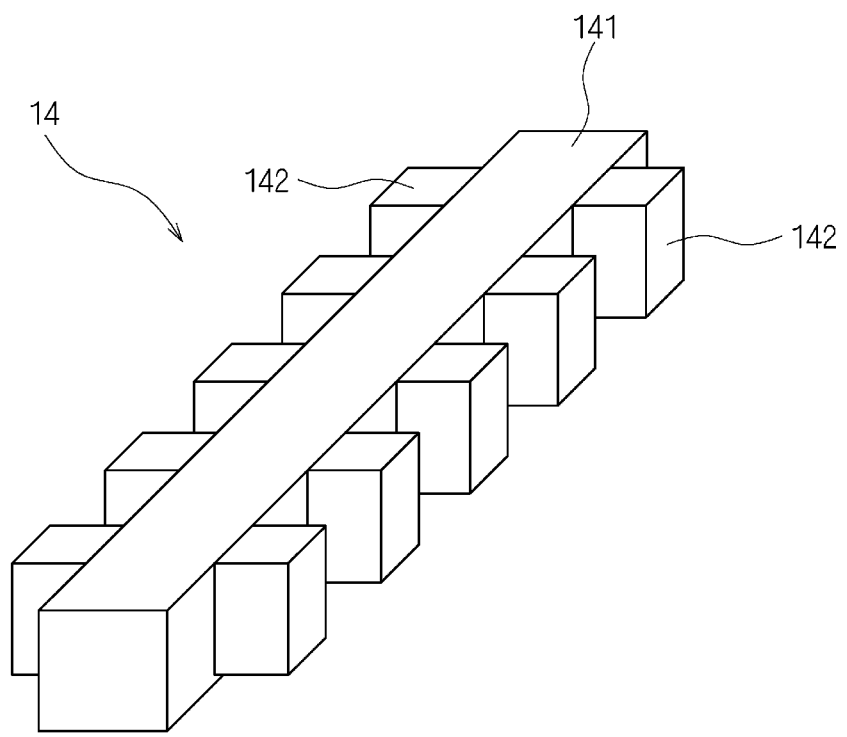
FIG. 1 is a perspective view that illustrates a configuration of a terminal connection substrate arranged in a module substrate according to a first preferred embodiment of the present invention.

FIG. 1 is a perspective view that illustrates a configuration of a terminal connection substrate arranged in a module substrate according to a first preferred embodiment of the present invention. A terminal connection substrate 14 according to the first preferred embodiment of the present invention includes an insulator 141 made of a ceramic, a glass, an epoxy resin, or the like and a plurality of columnar terminal electrodes 142 arranged in a line on each of both lateral surfaces of the insulator 141.

Each of the terminal electrodes 142 when the terminal connection substrate 14 is mounted on a base substrate may be preferably higher than an electronic component (SMD) mounted on the base substrate. When the terminal electrode 142 has the shape of a rectangular prism, as illustrated in FIG. 1, the rectangular prism shape having an aspect ratio of the height and width of the terminal electrode 142 (=height/width) of substantially one can prevent deformation of the terminal electrode 142.

Figure 2A:
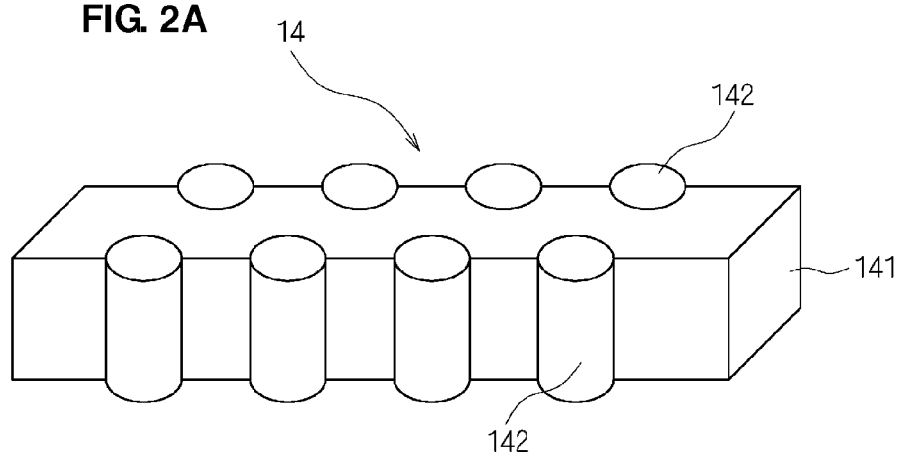
FIGS. 2A-2C include perspective views that illustrate other configurations of the terminal connection substrate arranged in the module substrate according to the first preferred embodiment of the present invention.
Figure 2B:
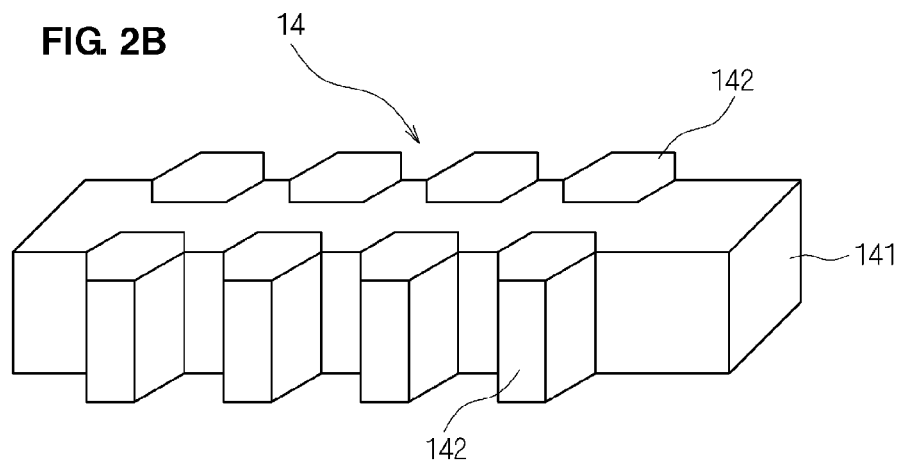
Figure 2C:
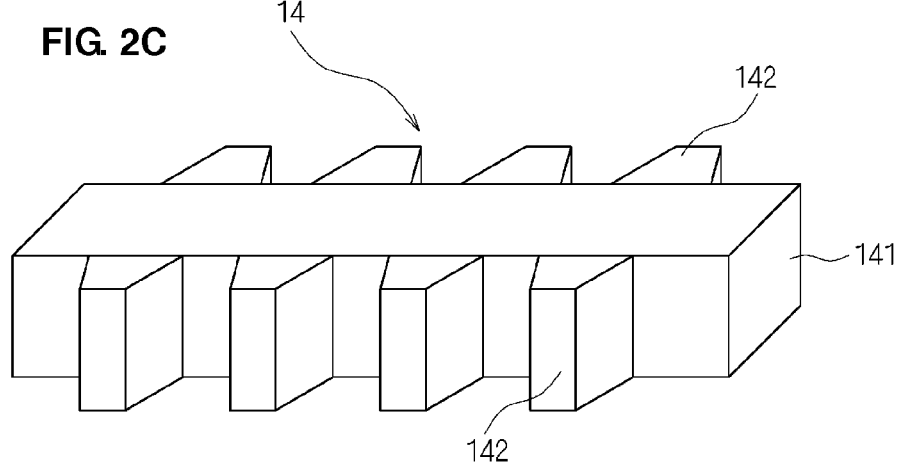

FIGS. 2A-2C include perspective views that illustrate other configurations of the terminal connection substrate 14 arranged in the module substrate according to the first preferred embodiment of the present invention. The shape of each of the plurality of columnar terminal electrodes 142 arranged on both lateral surfaces of the insulator 141 is not limited to a rectangular prism, such as the one illustrated in FIG. 1; for example, it may be a circular cylinder illustrated in FIG. 2A, a hexagonal prism illustrated in FIG. 2B, or a trapezoidal prism illustrated in FIG. 2C.

Figure 3A:
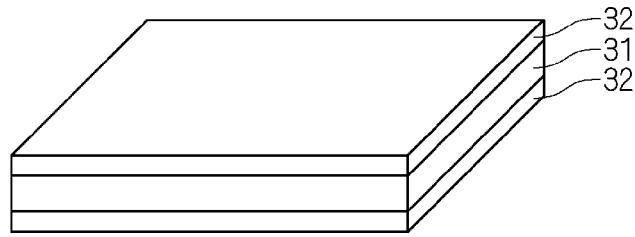
FIGS. 3A-3E include perspective views that illustrate steps of manufacturing the terminal connection substrate arranged in the module substrate according to the first preferred embodiment of the present invention.

FIGS. 3A-3E include perspective views that illustrate steps of manufacturing the terminal connection substrate 14 arranged in the module substrate according to the first preferred embodiment of the present invention. First, as illustrated in FIG. 3A, copper foil 32 having a predetermined thickness is attached to each of both sides of an insulating substrate 31 made of a ceramic, a glass, an epoxy resin, or the like. In the first preferred embodiment, the thickness of the copper foil 32 for each side preferably is about 300 μm, for example. The insulating substrate 31, which is preferably made of an epoxy resin or the like, may be a rigid substrate, or alternatively, may be a flexible substrate, for example. The copper foil 32 is not limited to pure copper; it may be a copper alloy, such as phosphor bronze or brass, for example. Because a copper alloy can be processed more easily than pure copper, a burr, elongation, and the like do not easily occur at the time of division by a dicer, at the time of grinding the top surface, or the like.

The copper foil 32 may be made to have a predetermined thickness by plating. For example, the copper foil 32 having a thickness of about 150 μm may be attached to each of both sides of the insulating substrate 31, and plating may be applied thereon such that the total thickness of the copper foil 32 and the plating is about 200 μm to about 400 μm. The thickness of the copper foil 32 may be about 100 μm to about 500 μm, and preferably, it may be about 200 μm to about 400 μm, for example.

When the terminal electrode 142 has the shape of a rectangular prism, the thickness of the copper foil 32 is the length of a side of a cross section of the terminal electrode 142. When the length of the side of the terminal electrode 142 is about 200 μm or more, even if a relatively large current of several amperes passes through the terminal electrode 142, no break occurs. When the length of the side of the terminal electrode 142 is about 400 μm or less, for example, because its height is relatively small, the terminal electrode 142 is not easily deformable.

Figure 3B:
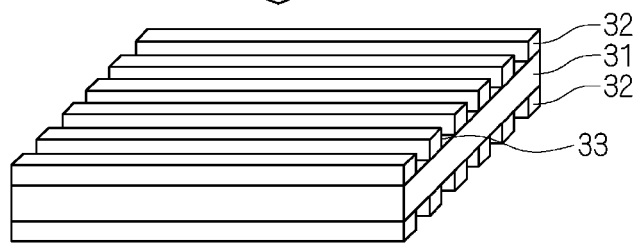

Next, as illustrated in FIG. 3B, a plurality of grooves 33 is formed in the same locations on the front and back sides of the attached copper foil 32 such that the grooves 33 resemble the teeth of a comb. A method of forming the grooves 33 is not particularly limited. Any method by which the copper foil can be reliably removed and the grooves 33 can be formed, such as etching, cutting by a dicer, processing of a combined use of both, and the like, may be used.

When the plurality of grooves 33 is formed by etching, each of the terminal electrodes 142 has the shape of a trapezoidal prism, as illustrated in FIG. 2C. This is because the sections nearer the surface are more easily etched. When the plurality of grooves 33 is formed by cutting by a dicer, each of the terminal electrodes 142 has the shape of a rectangular prism, as illustrated in FIG. 1. Accordingly, because a cross-sectional area of the terminal electrode 142 formed by cutting by a dicer is larger than that formed by other methods, the withstand current value can be large. A dicer having multiple blades, a multi-wire saw, and the like may also be used to shorten a cutting time.

In addition, instead of the copper foil 32, copper wire, copper bars, or the like each having the shape of a circular cylinder, a hexagonal prism, or the like may be attached directly to both sides of the insulating substrate 31 at predetermined intervals. This enables manufacturing the terminal connection substrate 14 including the plurality of terminal electrodes 142 each having the shape of a circular cylinder illustrated in FIG. 2A and that including the plurality of terminal electrodes 142 each having the shape of a hexagonal prism illustrated in FIG. 2B.

When the shape of a cross section of each of the terminal electrodes 142 is a rectangle (square), the width of each of the remaining sections of the copper foil 32 after the formation of the plurality of grooves 33 is the width of each of the terminal electrodes 142 mounted on the base substrate.

Figure 3C:
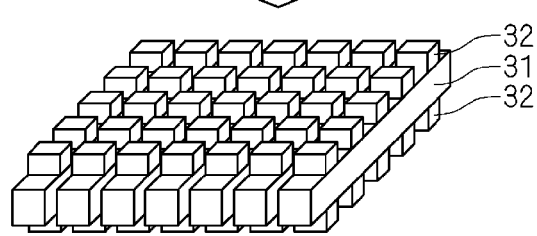
Figure 3D:
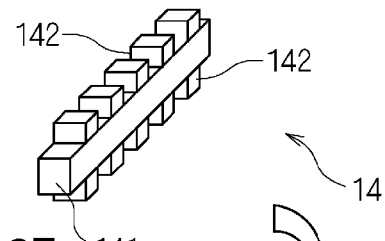
Figure 3E:
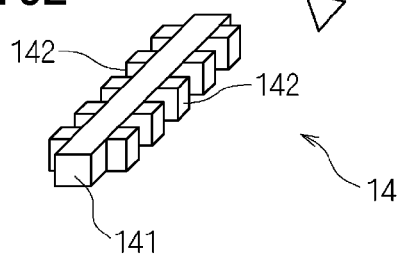

Then, as illustrated in FIG. 3C, the insulating substrate 31 is divided along a direction that crosses each of the plurality of formed grooves 33, for example, at right angles by a dicer, and the terminal connection substrates 14, one of which is illustrated in FIG. 3D, is obtained therefrom. The width in the insulating substrate 31 divided and obtained by the dicer is the height of the terminal electrode 142 when the terminal connection substrate 14 is mounted on the base substrate. Accordingly, it is preferable that the width in dividing and cutting by the dicer be larger by at least about 100 μm, for example, than the height of an electronic component mounted on the base substrate. This is because, depending on variations in the heights of electronic components mounted on the base substrate, the height of an electronic component may be larger than the height of the terminal electrode 142 and poor connection may occur between the terminal electrode 142 and the mother substrate. The plurality of terminal electrodes 142 of the terminal connection substrate 14 obtained by cutting is subjected to plating or rustproofing, the terminal connection substrate 14 is rotated by 90 degrees as illustrated in FIG. 3E, and the terminal connection substrate 14 is mounted in a predetermined location of the base substrate in the state where the plurality of terminal electrodes 142 is arranged on both lateral surfaces of the insulator 141. The plating film is formed by wet plating or the like of nickel/tin, nickel/gold, or the like. The rustproofing can prevent advancing of oxidation of copper used in the terminal electrodes 142 and can enhance solder wettability at the time of mounting.

Moreover, the terminal connection substrates 14 each including a desired number of terminal electrodes 142 can be manufactured by dividing at a desired groove 33 out of the plurality of grooves 33 formed by the dicer.

A resist may be printed between the terminal electrodes 142. FIG. 4 is a perspective view that illustrates a configuration of the terminal connection substrate 14 including resists printed between the terminal electrodes 142 and arranged in the module substrate according to the first preferred embodiment of the present invention. As illustrated in FIG. 4, resists 143 are printed such that the gaps between the terminal electrodes 142 arranged in a line on each of both lateral surfaces of the insulator 141 are filled with the resists 143. With this, a burr, elongation, and the like that will easily occur in the terminal electrodes 142 at the time of dividing or the like can be prevented, and deformation of the terminal electrodes 142 can also be prevented.

Figure 5A:
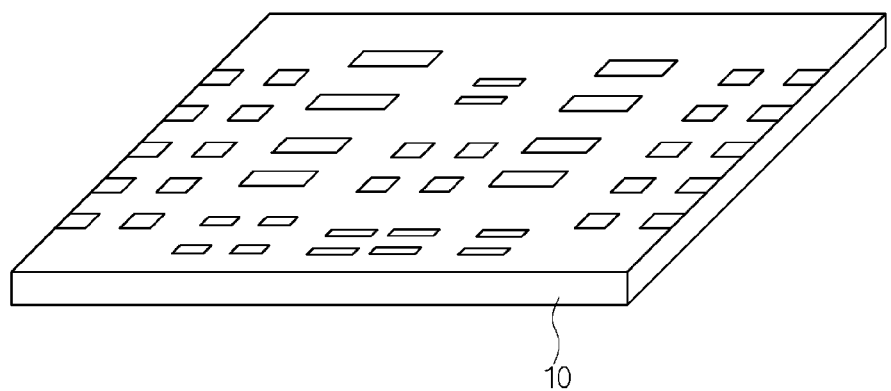
FIGS. 5A and 5B include perspective views that illustrate steps of manufacturing the module substrate according to the first preferred embodiment of the present invention.
Figure 5B:
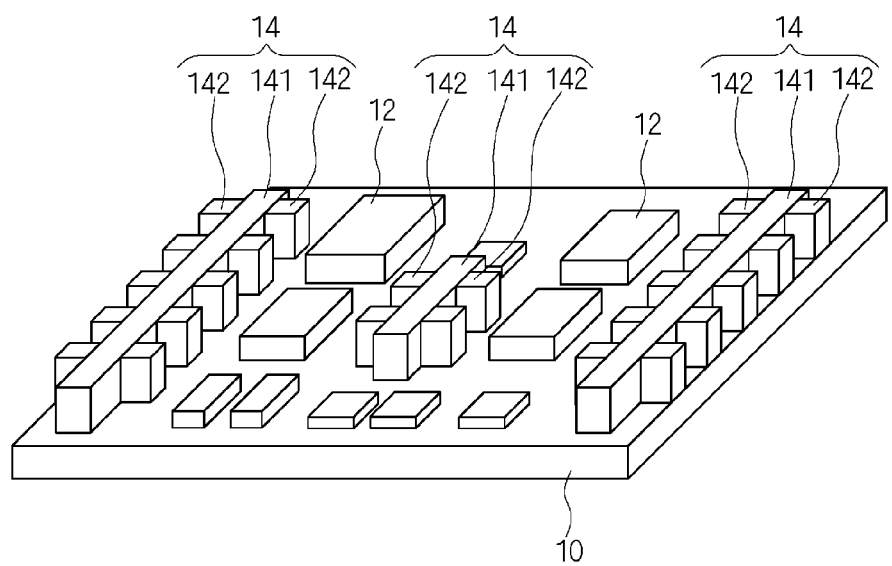

FIGS. 5A and 5B include perspective views that illustrate steps of manufacturing the module substrate according to the first preferred embodiment of the present invention. First, as illustrated in FIG. 5A, solder is printed on desired surface electrodes out of the surface electrodes on a base substrate 10 whose outer shapes are rectangular or substantially rectangular. The base substrate 10 can be a low temperature co-fired ceramics (LTCC) substrate, an organic substrate, or the like and is not particularly limited.

When the base substrate 10 is produced using an LTCC substrate, ceramic slurry coating is first applied on a PET film, it is then dried, and a ceramic green sheet having a thickness of 10 to 200 μm is produced. Via holes each having a diameter of approximately 0.1 mm are formed in the produced ceramic green sheet from the PET film side using a mold, a laser, or the like.

Next, electrode paste in which metal powder whose main component is silver or copper, a resin, and an organic solvent are mixed and kneaded is charged into the via holes and is dried. Then, a desired pattern of equivalent electrode paste is screen-printed or the like on the ceramic green sheet, and it is dried.

In this state, a plurality of ceramic green sheets is stacked, and they are pressed and bonded with a pressure of about 100 kg/cm$^2$ to about 1500 kg/cm$^2$ at a temperature of about 40° C. to about 100° C., for example. After that, when the electrode paste is predominantly composed of silver, the lamination is fired in the air at approximately 850° C.; when the electrode paste is predominantly composed of copper, the lamination is fired in an atmosphere of nitrogen at approximately 950° C., for example. A film is formed on the electrodes by wet plating of nickel/tin, nickel/gold, or the like. In this way, the base substrate 10 is formed.

Next, as illustrated in FIG. 5B, a plurality of electronic components 12 is mounted on the surface electrodes on which solder is printed, and the plurality of terminal connection substrates 14 is also mounted. The terminal connection substrates 14 are mounted in the locations that are not in contact with the plurality of electronic components 12 such that one end side of each of the terminal electrodes 142 is in contact with the base substrate 10. For example, as illustrated in FIG. 5B, the terminal connection substrates 14 may be arranged on two opposite sides of the outer sides of the base substrate 10, or alternatively, the terminal connection substrates 14 may be arranged on the four outer sides of the base substrate 10. The plurality of electronic components 12 can be mounted on not only the front side but also the back side of the base substrate 10.

Each of the plurality of terminal connection substrates 14 can be arranged in a location other than the neighborhood of the outer sides of the base substrate 10 if desired. For example, if the terminal connection substrate 14 is arranged in a substantially central portion of the base substrate 10, because no insulators exist between the plurality of terminal electrodes 142 and the plurality of electronic components 12, they can be adjacent to each other; if the same number of the terminal electrodes 142 and the electronic components 12 are provided, the module substrate can be miniaturized.

Figure 6:
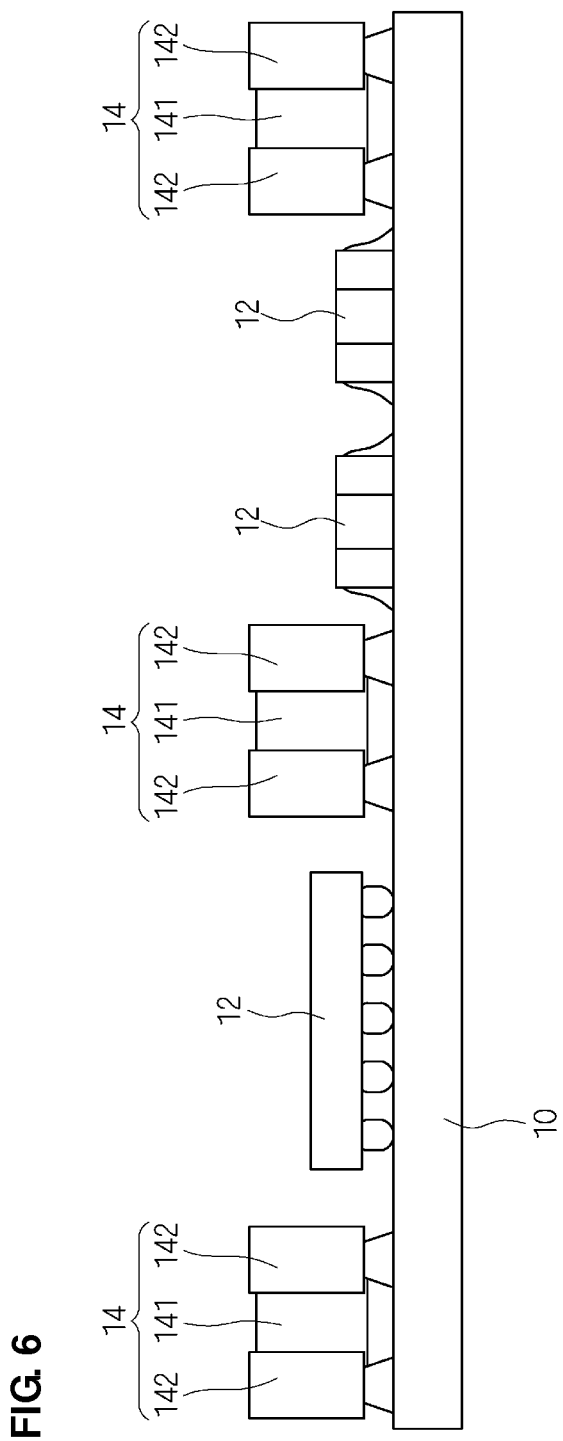
FIG. 6 is a cross-sectional view in a plane orthogonal to the direction in which the terminal connection substrates in the module substrate according to the first preferred embodiment of the present invention are arranged.

FIG. 6 is a cross-sectional view in a plane orthogonal to the direction in which the terminal connection substrates 14 in the module substrate according to the first preferred embodiment of the present invention are arranged. In the example illustrated in FIG. 6, the terminal connection substrates 14 are arranged approximately in contact with two opposite sides of the outer sides of the base substrate 10 and also arranged in a substantially central portion of the base substrate 10.

As described above, according to the first preferred embodiment, because electrical connection can be made using not a thin plating film formed in a through hole but the columnar terminal electrodes 142, a relatively large current can be passed. A complicated step, such as forming a through hole and forming a plating film, is not necessary, the manufacturing steps can be simplified, and thus the manufacturing cost as a whole can be reduced.

Second Preferred Embodiment

A configuration of the terminal connection substrate arranged in the module substrate according to a second preferred embodiment of the present invention preferably is substantially the same as that in the first preferred embodiment, and thus the same reference numerals are used and the detailed description is not repeated here. The module substrate according to the second preferred embodiment of the present invention differs from that in the first preferred embodiment in that, after the plurality of electronic components 12 and the plurality of terminal connection substrates 14 are mounted on the base substrate 10, the plurality of mounted electronic components 12 and terminal connection substrates 14 are sealed with resin, and the top surface of the sealing resin is ground.

Figure 7A:
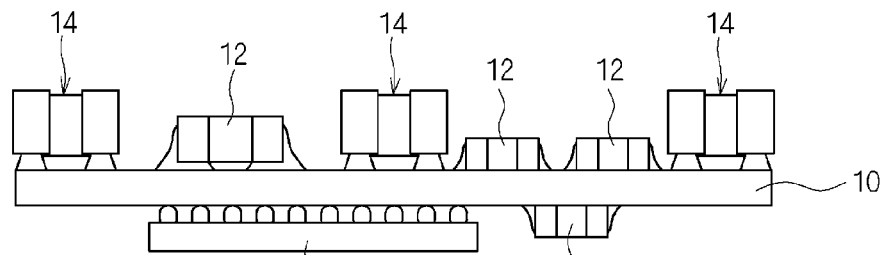
FIGS. 7A-7C include cross-sectional views that illustrate steps of manufacturing the module substrate according to a second preferred embodiment of the present invention in a plane orthogonal to the direction in which the terminal connection substrates are arranged.
Figure 7B:
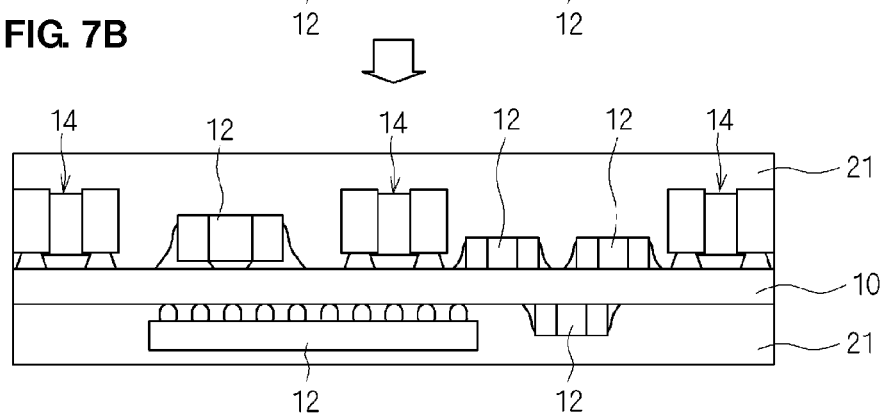
Figure 7C:
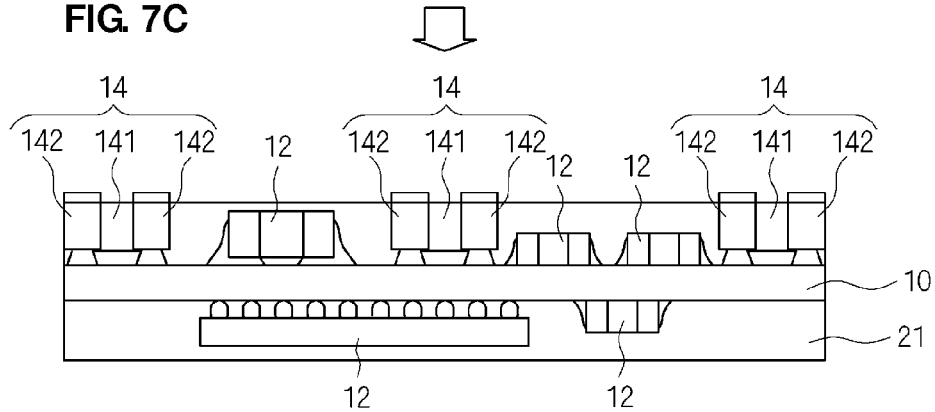

FIGS. 7A-7C include cross-sectional views that illustrate steps of manufacturing the module substrate according to the second preferred embodiment of the present invention in a plane orthogonal to the direction in which the terminal connection substrates 14 are arranged. First, as illustrated in FIG. 7A, the plurality of electronic components 12 is mounted on the surface electrodes of the base substrate 10 on which solder is printed, and the plurality of terminal connection substrates is also mounted. The plurality of terminal connection substrates 14 is mounted such that they are arranged on the outer edge of the base substrate 10, for example, two opposite sides of the outer sides of the base substrate 10 and also mounted on a substantially central portion of the base substrate 10. The plurality of electronic components 12 can be mounted on not only the front side but also the back side of the base substrate 10. In the second preferred embodiment, they are mounted on both of the front and back sides.

Then, as illustrated in FIG. 7B), a resin sheet (resin) 21 is laminated to each of both the front and back sides. As the resin sheet 21, one in which a composite resin is molded and semi-cured on a PET film is used. The composite resin preferably is a composite material in which a thermosetting resin, such as epoxy, phenol, or cyanate, and an inorganic filler, such as aluminum oxide ($Al_2O_3$), silicon dioxide ($SiO_2$), or titanium dioxide ($TiO_2$), are mixed, for example. In laminating the resin sheet 21, arranging a spacer having a desired thickness around the base substrate 10 enables the laminated resin sheet 21 to have a desired thickness. The base substrate 10 in this state is placed in an oven, and the resin sheet 21 is fully cured.

In the second preferred embodiment, as described above, the resin sheets 21 are collectively laminated and cured on both of the front and back sides. Alternatively, the resin sheet 21 for the front side and that for the back side may be individually laminated and cured.

Next, as illustrated in FIG. 7C, the top surface of the sealing resin sheet 21 is ground using a roller-type blade (not illustrated) or the like. Even if there are variations in the heights of the plurality of terminal connection substrates caused by solder or the like, because the plurality of terminal electrodes 142 is columnar, as a result of grinding the cured resin sheet 21, the shapes of the plurality of terminal electrodes 142 exposed from the top of the resin sheet 21 are substantially the same. Accordingly, the terminal electrodes 142 can be reliably connected to the mother substrate.

Then, nickel/gold plating is applied on the top surface of the plurality of exposed terminal electrodes 142. As a matter of course, before the application of nickel/gold plating, an NC electrode may be formed using conductive paste. The formation of the NC electrode can increase the number of electrodes to be connected to the mother substrate, impacts are easily dispersed, and thus resistance to impacts occurring when the module substrate drops is improved.

Figure 8A:
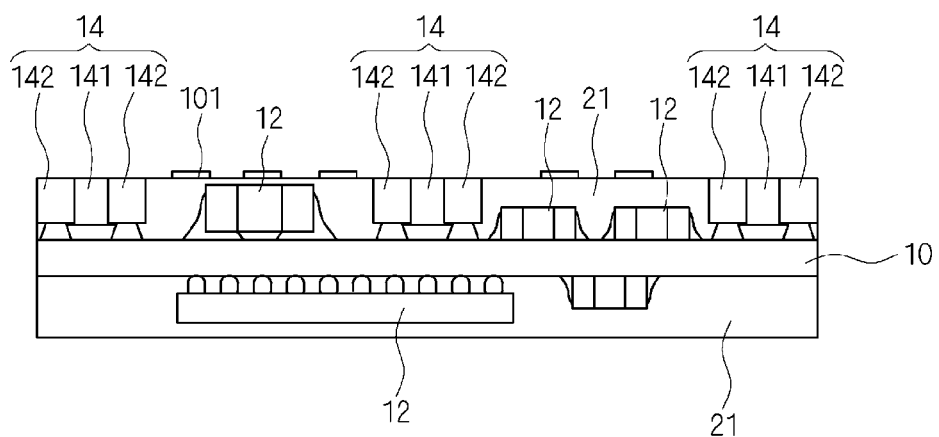
FIGS. 8A and 8B include cross-sectional views that illustrate steps in forming NC electrodes in the module substrate according to the second preferred embodiment of the present invention in a plane orthogonal to the direction in which the terminal connection substrates are arranged.
Figure 8B:
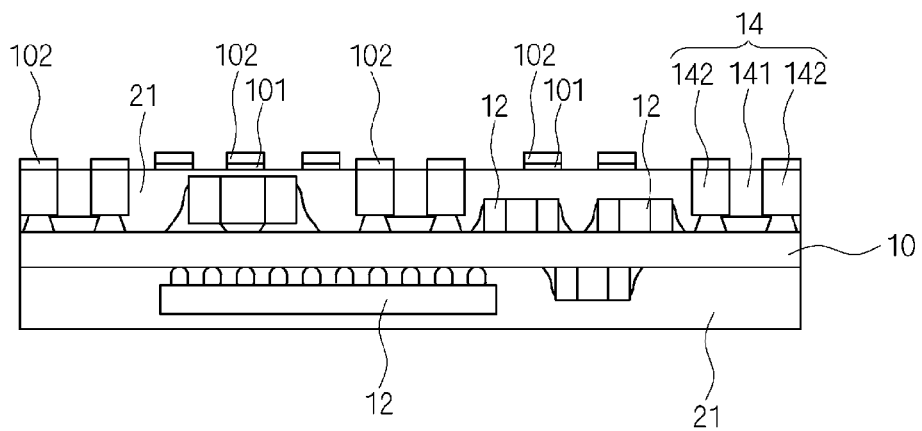

FIGS. 8A and 8B includes cross-sectional views that illustrate steps in forming NC electrodes in the module substrate according to the second preferred embodiment of the present invention in a plane orthogonal to the direction in which the terminal connection substrates 14 are arranged. As illustrated in FIG. 8A, before nickel/gold plating is applied on the top surfaces of the plurality of exposed terminal electrodes 142, a plurality of NC electrodes 101 is formed by being printed on the top surface of the sealing resin sheet 21. Then, as illustrated in FIG. 8B, nickel/gold plating 102 is applied on the top surfaces of the plurality of exposed terminal electrodes 142 and the top surfaces of the plurality of formed NC electrodes 101. In this way, the number of electrodes to be connected to the mother substrate can be increased, and thus resistance to impacts occurring when the module substrate drops is improved.

Before the application of the nickel/gold plating 102, a resist may be printed. FIGS. 9A and 9B include perspective views that illustrate steps in performing resist printing on the module substrate according to the second preferred embodiment of the present invention. In the example illustrated in FIG. 9A, each of the plurality of terminal electrodes 142 of the terminal connection substrate 14 has a hexagonal cross section. In FIG. 9B, a resist 111 is printed such that the shape of a cross section of each of the plurality of terminal electrodes 142 is a rectangular member 112, and nickel/gold plating is applied on the top surfaces of the plurality of exposed terminal electrodes 142.

In this way, because the outer edges of the plurality of terminal electrodes 142 can be covered, entry of moisture from the top surface or the like can be prevented, and reliability as the module substrate is improved. The shape of a cross section of each of the plurality of terminal electrodes 142 can also be easily changed to any shape, for example, from a hexagon to a rectangle in the examples illustrated in FIGS. 9A and 9B.

Moreover, before the application of nickel/gold plating, rewiring may be performed. When the terminal connection substrate 14 is arranged in the neighborhood of an outer side of the module substrate, the plurality of terminal electrodes 142 is concentrated on the outer edge of the module substrate. Therefore, rewiring is performed such that the locations of the terminal electrodes 142 are changed from the outer edge of the module substrate to desired locations.

The rewiring is performed on the top surface of the sealing resin sheet 21 by screen printing, ink jet printing, or the like. The rewiring may be performed by electroless plating after a shield wiring pattern is formed. A solder resist may be printed in the vicinity of the rewired terminal electrodes 142, and a bump for external connection may be formed.

Figure 10:
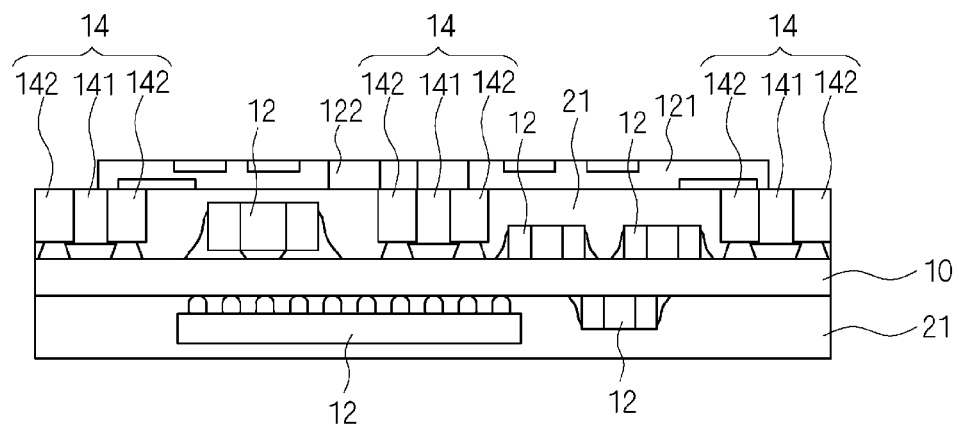
FIG. 10 is a cross-sectional view in a plane orthogonal to the direction in which the terminal connection substrates are arranged, in performing rewiring on the module substrate according to the second preferred embodiment of the present invention.

FIG. 10 is a cross-sectional view in a plane orthogonal to the direction in which the terminal connection substrates 14 are arranged, in performing rewiring on the module substrate according to the second preferred embodiment of the present invention. As illustrated in FIG. 10, a solder resist 121 is printed in the vicinity of the rewired pattern, and a plurality of bumps 122 is formed in accordance with the rewired pattern. Therefore, the locations of external electrodes are not limited to the locations of the plurality of terminal electrodes 142 (the neighborhood of an outer side of the module substrate), and the flexibility in design is improved.

As described above, according to the second preferred embodiment, because electrical connection can be made using not a thin plating film formed in a through hole but the columnar terminal electrodes 142, a relatively large current can be passed. A complicated step, such as forming a through hole and forming a plating film, is not necessary, the manufacturing steps can be simplified, and thus the manufacturing cost as a whole can be reduced.

Third Preferred Embodiment

Figure 11A:
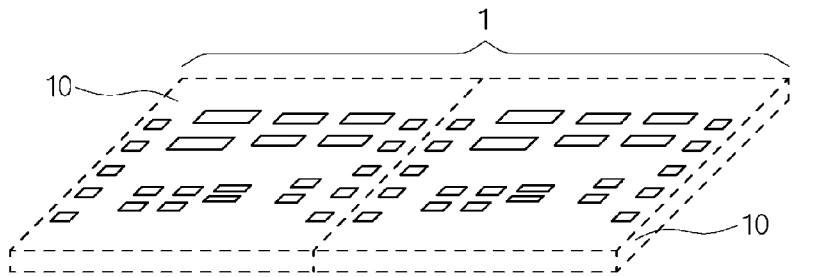
FIGS. 11A-11D include perspective views that illustrate steps of manufacturing the module substrate according to a third preferred embodiment of the present invention.

FIGS. 11A-11D include perspective views that illustrate steps of manufacturing the module substrate according to a third preferred embodiment of the present invention. First, as illustrated in FIG. 11A, solder is printed on desired surface electrodes out of the surface electrodes of a composite substrate 1 from which a plurality of module substrates (base substrates 10) can be cut. The composite substrate 1 can be a low temperature co-fired ceramics (LTCC) substrate, an organic substrate, or the like and is not particularly limited.

In producing the module substrate using an LTCC substrate, ceramic slurry coating is first applied on a PET film, it is then dried, and a ceramic green sheet having a thickness of about 10 μm to about 200 μm, for example, is produced. Via holes each having a diameter of approximately 0.1 mm are formed in the produced ceramic green sheet from the PET film side using a mold, a laser, or the like.

Next, electrode paste in which metal powder whose main component is silver or copper, a resin, and an organic solvent are mixed and kneaded is charged into the via holes and is dried. Then, a desired pattern of equivalent electrode paste is screen-printed or the like on the ceramic green sheet, and it is dried.

In this state, a plurality of ceramic green sheets is stacked, and they are pressed and bonded with a pressure of about 100 kg/cm$^2$ to about 1500 kg/cm$^2$ at a temperature of about 40° C. to about 100° C., for example. After that, when the electrode paste is predominantly composed of silver, the lamination is fired in the air at approximately 850° C.; when the electrode paste is predominantly composed of copper, the lamination is fired in an atmosphere of nitrogen at approximately 950° C., for example. A film is formed on the electrodes by wet plating of nickel/tin, nickel/gold, or the like. In this way, the composite substrate 1 is formed.

Figure 11B:
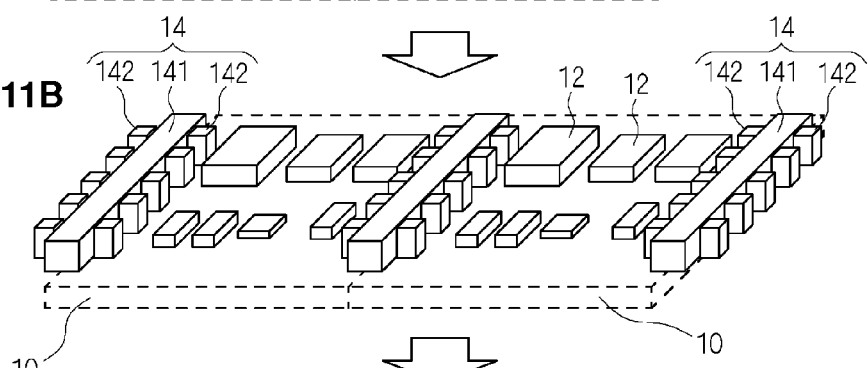

Next, as illustrated in FIG. 11B, the plurality of electronic components 12 is mounted on the surface electrodes on which solder is printed, and the plurality of terminal connection substrates 14 is also mounted. Each of the terminal connection substrates 14 is mounted so as to extend over the border between two neighboring module substrates. That is, as illustrated in FIG. 11B, the terminal connection substrates 14 may be arranged on two opposite sides of the outer sides of each of the base substrates 10, or alternatively, the terminal connection substrates 14 may be arranged on the four outer sides of the base substrate 10. The electronic components 12 can be mounted on not only the front side but also the back side of the composite substrate 1.

Each of the plurality of terminal connection substrates 14 can be arranged in a location other than the location extending over the border between two neighboring module substrates if desired. For example, if the terminal connection substrate 14 is arranged in a substantially central portion of the module substrate, because no insulators exist between the plurality of terminal electrodes 142 and the plurality of electronic components 12, they can be adjacent to each other; if the same number of the terminal electrodes 142 and the electronic components 12 are provided, the module substrate can be miniaturized.

Figure 11C:
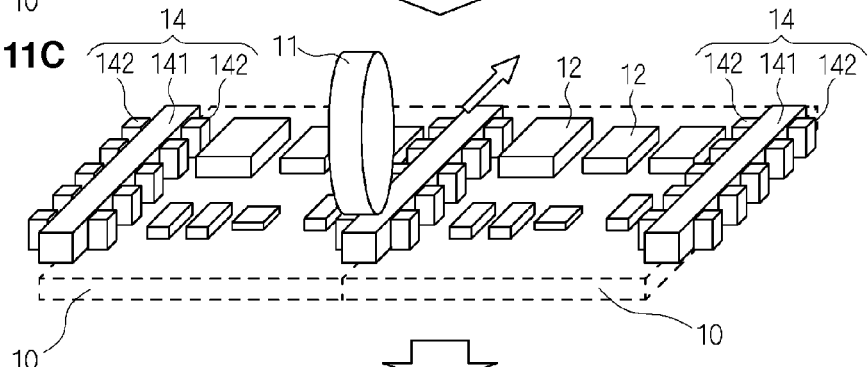
Figure 11D:
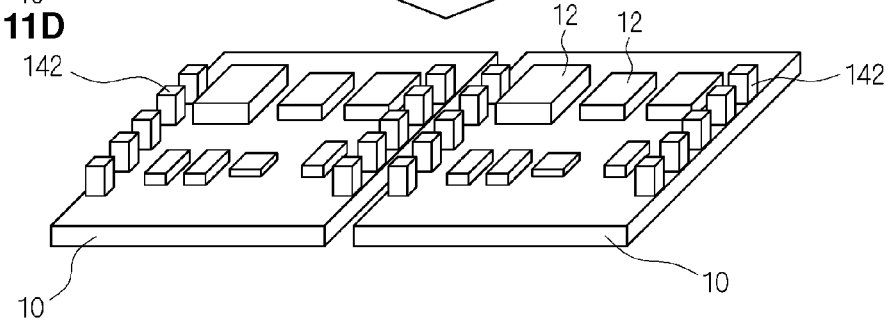

Then, as illustrated in FIG. 11C, the composite substrate 1 is divided into two module substrates using a dicer 11 along the insulator 141 in the terminal connection substrate arranged so as to extend over the border between the two neighboring module substrates. When the thickness of the blade of the dicer 11 is larger than the width of the insulator 141, the insulator 141 is fully removed at the time of dividing. Thus, the module substrates in which the plurality of terminal electrodes 142 is exposed on a periphery thereof can be cut from the composite substrate 1, as illustrated in FIG. 11D. A film is formed on the plurality of terminal electrodes 142 exposed on the periphery thereof by wet plating or the like of nickel/tin, nickel/gold, or the like.

Figure 12:
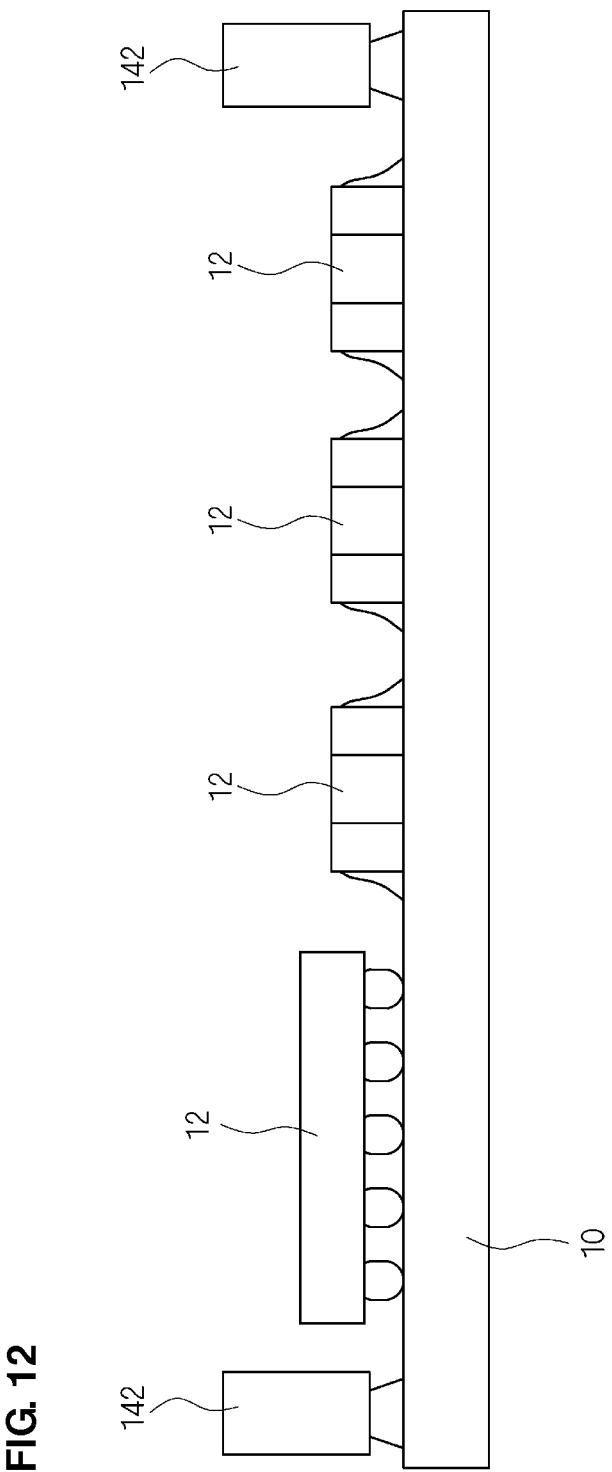
FIG. 12 is a cross-sectional view in a plane orthogonal to the direction in which the module substrate according to the third preferred embodiment of the present invention is divided by a dicer.

FIG. 12 is a cross-sectional view in a plane orthogonal to the direction in which the module substrate according to the third preferred embodiment of the present invention is divided by the dicer 11. As illustrated in FIG. 12, the insulators 141 in the terminal connection substrates 14 are fully removed, and only the columnar terminal electrodes 142 remain on both peripheries of the module substrate. Therefore, there are no redundant insulators other than the plurality of terminal electrodes 142, and a region where the electronic components 12 are mountable can be maximized. Accordingly, the number of mountable electronic components 12 can be increased, and when a given number of electronic components 12 are mounted, the module substrate can be miniaturized.

Figure 13:
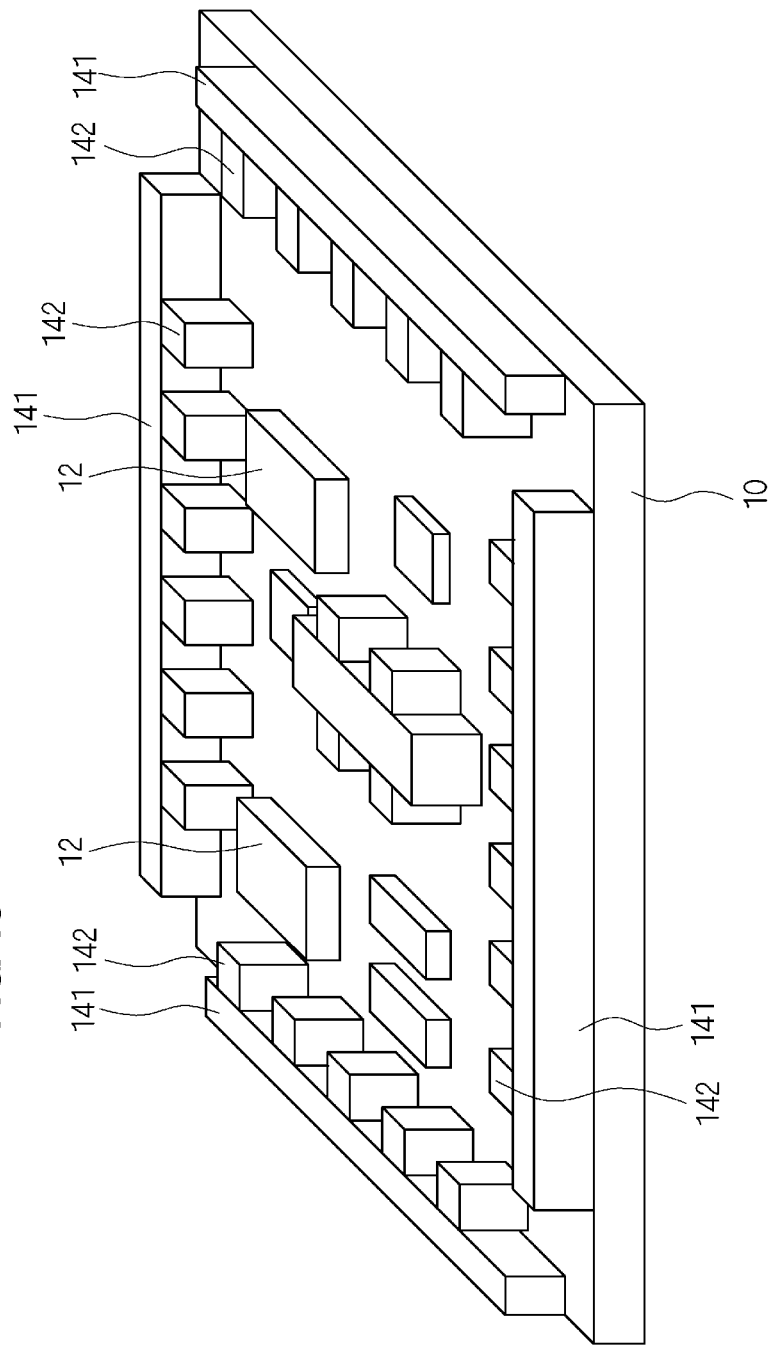
FIG. 13 is a perspective view that illustrates a case where insulators in the module substrate according to the third preferred embodiment of the present invention remain.
Figure 14:
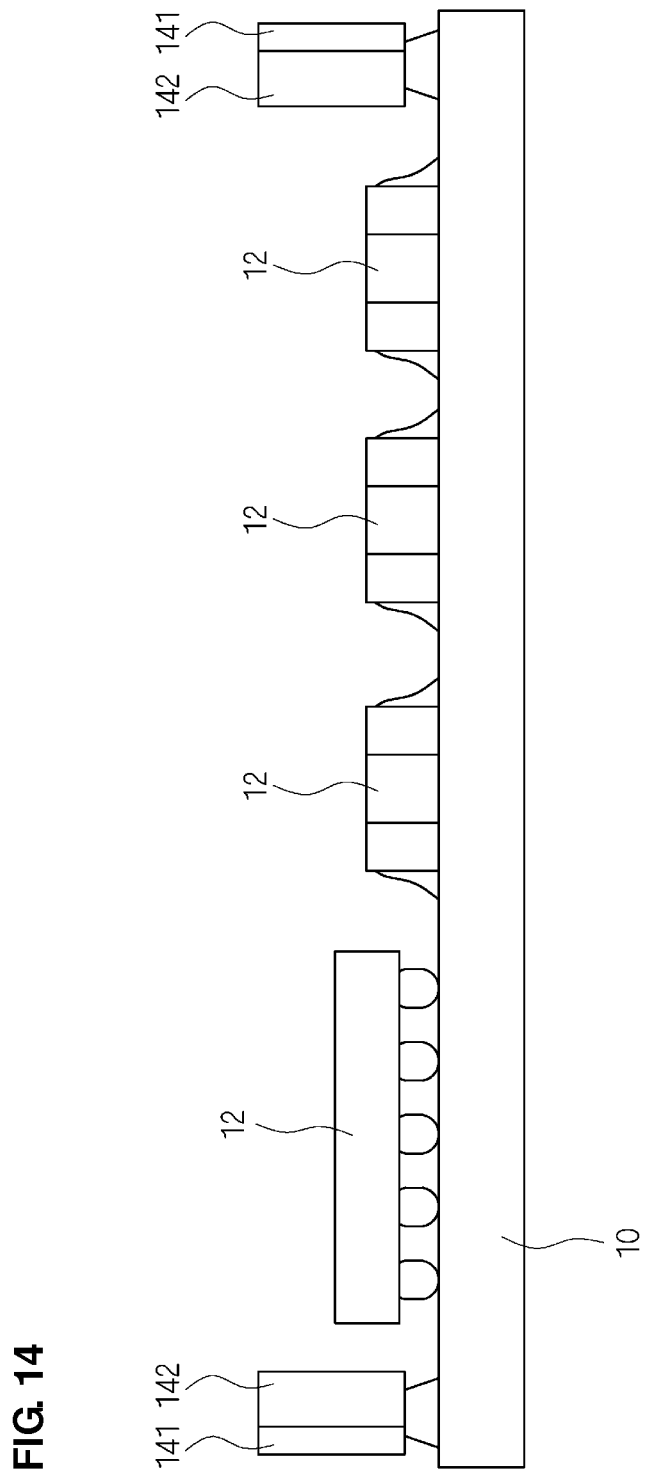
FIG. 14 is a cross-sectional view in a plane orthogonal to the direction of division by a dicer in the case where the insulators in the module substrate according to the third preferred embodiment of the present invention remain.

The thickness of the blade of the dicer 11 may be smaller than the width of the insulator 141. In this case, the insulator 141 is not fully removed and remains at the time of dividing. Thus, the module substrates in which the plurality of terminal electrodes 142 is not exposed on the peripheries can be cut from the composite substrate 1. FIG. 13 is a perspective view that illustrates a case where the insulators 141 in the module substrate according to the third preferred embodiment of the present invention remain. FIG. 14 is a cross-sectional view in a plane orthogonal to the direction of division by the dicer 11 in the case where the insulators 141 in the module substrate according to the third preferred embodiment of the present invention remain.

As illustrated in FIGS. 13 and 14, because each of the insulators 141 remains outside the plurality of terminal electrodes 142, the plurality of terminal electrodes 142 on the peripheries can be protected from oxidation and the like. Because the plurality of terminal electrodes 142 is not exposed on the peripheries, solder can be prevented from getting wet and spread over the peripheries of the module substrate, and insulation from an external shield can be reliably enabled.

In the third preferred embodiment, the terminal connection substrate 14 in which the plurality of columnar terminal electrodes 142 is arranged on both lateral surfaces of the insulator 141 is divided after being mounted on the composite substrate 1, thus producing the terminal connection substrate 14 in which the plurality of columnar terminal electrodes 142 is arranged on a single lateral surface of the insulator 141. Alternatively, the terminal connection substrate 14 in which the plurality of columnar terminal electrodes 142 is arranged on a single lateral surface of the insulator 141 may be prepared in advance, and that terminal connection substrate 14 may be mounted on the composite substrate 1 or the base substrate 10 cut therefrom to produce the module substrate.

Figure 15:
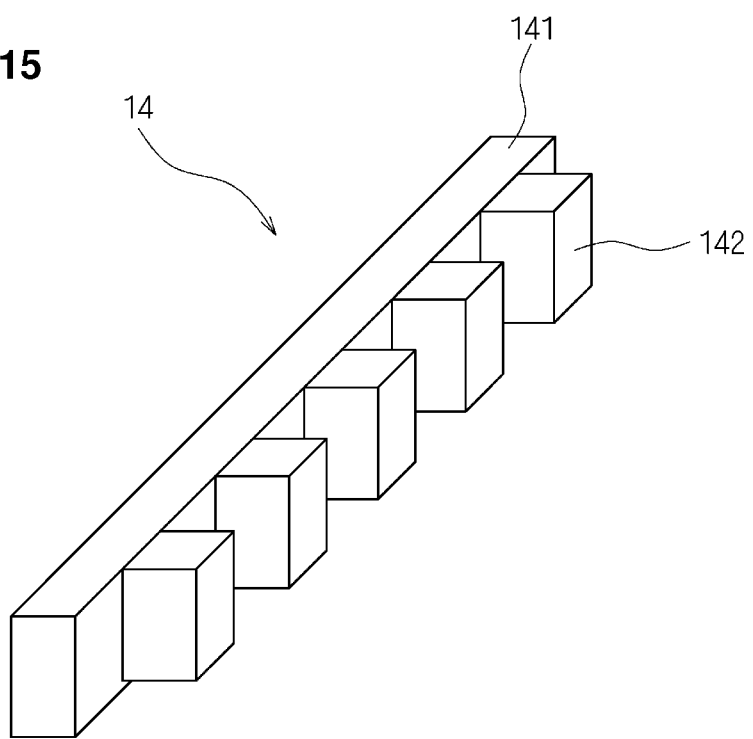
FIG. 15 is a perspective view that illustrates another configuration of the terminal connection substrate arranged in the module substrate according to the third preferred embodiment of the present invention.

FIG. 15 is a perspective view that illustrates another configuration of the terminal connection substrate 14 arranged in the module substrate according to the third preferred embodiment of the present invention. As illustrated in FIG. 15, in the terminal connection substrate 14, the columnar terminal electrodes 142 are arranged on a single lateral surface of the insulator 141.

As described above, according to the third preferred embodiment, a grinding step, a via-hole forming step, and the like are not necessary in the manufacturing steps, and the manufacturing cost can be greatly reduced. The insulator 141 in the terminal connection substrate 14 is fully removed, and only the plurality of columnar terminal electrodes 142 remains on both peripheries of the module substrate. Therefore, there are no redundant insulators other than the plurality of terminal electrodes 142, and a region where the electronic components 12 are mountable can be maximized. Accordingly, the number of mountable electronic components 12 can be increased, and if a given number of electronic components 12 are mounted, the module substrate can be miniaturized.

Ends of the plurality of terminal electrodes 142 are reliably exposed, there is no possibility that poor connection occurs. Additionally, the terminal electrodes 142 are not easily deformable because their heights are relatively small, and there is less likelihood of short-circuiting the neighboring terminal electrodes 142.

Fourth Preferred Embodiment

A configuration of the terminal connection substrate arranged in the module substrate according to a fourth preferred embodiment of the present invention is substantially the same as that in the third preferred embodiment, and thus the same reference numerals are used and the detailed description is not repeated here. A method of manufacturing the module substrate according to the fourth preferred embodiment of the present invention differs from that in the third preferred embodiment in that, after the plurality of electronic components and the plurality of terminal connection substrates 14 are mounted on the composite substrate 1, the plurality of mounted electronic components 12 and terminal connection substrates 14 are sealed with resin, and the top surface of the sealing resin is ground.

FIGS. 16A-16D include cross-sectional views that illustrate steps of manufacturing the module substrate according to the fourth preferred embodiment of the present invention in a plane orthogonal to the direction in which the terminal connection substrates 14 are arranged. First, as illustrated in FIG. 16A, the plurality of electronic components 12 is mounted on the surface electrodes of the composite substrate 1 on which solder is printed, and the plurality of terminal connection substrates 14 is also mounted. Each of the plurality of terminal connection substrates 14 is mounted so as to extend over the border between two neighboring module substrates. The plurality of electronic components 12 can be mounted on not only the front side but also the back side of the composite substrate 1. In the fourth preferred embodiment, they are mounted on both of the front and back sides.

Then, as illustrated in FIG. 16B, the resin sheet 21 is laminated to each of both the front and back sides. As the resin sheet (resin) 21, one in which a composite resin is molded and semi-cured on a PET film is preferably used, for example. The composite resin preferably is a composite material in which a thermosetting resin, such as epoxy, phenol, or cyanate, and an inorganic filler, such as aluminum oxide ($Al_2O_3$), silicon dioxide ($SiO_2$), or titanium dioxide ($TiO_2$), are mixed, for example. In laminating the resin sheet 21, arranging a spacer having a desired thickness around the location at which the module substrate is cut from the composite substrate 1 enables the laminated resin sheet 21 to have a desired thickness. The composite substrate 1 in this state is placed in an oven, and the resin sheet 21 is fully cured.

In the fourth preferred embodiment, as described above, the resin sheets 21 are collectively laminated and cured on both of the front and back sides. Alternatively, the resin sheet 21 for the front side and that for the back side may be individually laminated and cured.

Next, as illustrated in FIG. 16C, the composite substrate 1 is sealed using the resin sheet 21, and the top surface of the sealing resin sheet 21 is ground using a roller-type blade (not illustrated) or the like. Even if there are variations in the heights of the plurality of terminal connection substrates 14 caused by solder or the like, because the plurality of terminal electrodes 142 is columnar, as a result of grinding the cured resin sheet 21, the shapes of the plurality of exposed terminal electrodes 142 are substantially the same. Accordingly, the terminal electrodes 142 can be reliably connected to the mother substrate.

Then, nickel/gold plating is applied on the top surface of the plurality of exposed terminal electrodes 142. As a matter of course, before the application of nickel/gold plating, an NC electrode may be formed using conductive paste. The formation of the NC electrode can increase the number of electrodes to be connected to the mother substrate, impacts are easily dispersed, and thus resistance to impacts occurring when the module substrate drops is improved.

FIGS. 17A and 17B include cross-sectional views that illustrate steps in forming NC electrodes in the module substrate according to the fourth preferred embodiment of the present invention in a plane orthogonal to the direction in which the terminal connection substrates 14 are arranged. As illustrated in FIG. 17A, before nickel/gold plating is applied on the top surfaces of the plurality of exposed terminal electrodes 142, the plurality of NC electrodes 101 is printed on the top surface of the sealing resin sheet 21. Then, as illustrated in FIG. 17B, the nickel/gold plating 102 is applied on the top surfaces of the plurality of exposed terminal electrodes 142 and the top surfaces of the plurality of printed NC electrodes 101. In this way, the number of electrodes to be connected to the mother substrate can be increased, and thus resistance to impacts occurring when the module substrate drops is improved.

Before the application of the nickel/gold plating 102, a resist may be printed. FIGS. 18A and 18B include perspective views that illustrate steps in performing resist printing on the module substrate according to the fourth preferred embodiment of the present invention. In the example illustrated in FIG. 18A, each of the plurality of terminal electrodes 142 of the terminal connection substrate 14 has a hexagonal cross section. In FIG. 18B, the resist 111 is printed such that the shape of a cross section of each of the plurality of terminal electrodes 142 is the rectangular member 112, and nickel/gold plating is applied in the location in contact with the exposed section of the top surface of each of the plurality of exposed terminal electrodes 142.

With this, because the outer edges of the plurality of terminal electrodes 142 can be covered, entry of moisture from the top surface or the like can be prevented, and reliability as the module substrate is improved. The shape of a cross section of each of the plurality of terminal electrodes 142 can also be easily changed to any shape, for example, from a hexagon to a rectangle in the examples illustrated in FIG. 18.

Moreover, before the application of nickel/gold plating, rewiring may be performed. The plurality of terminal electrodes 142 may be disposed in accordance with the location in which the terminal connection substrate 14 is arranged. In this case, the plurality of terminal electrodes 142 is concentrated on the outer edge of the module substrate. Therefore, rewiring is performed such that the locations of the terminal electrodes 142 are changed from the outer edge of the module substrate to desired locations.

The rewiring is performed on the top surface of the sealing resin sheet 21 by screen printing, ink jet printing, or the like. The rewiring may be performed by electroless plating after a shield wiring pattern is formed. A solder resist may be printed in the vicinity of the rewired terminal electrodes 142, and a bump for external connection may be formed.

Figure 19:
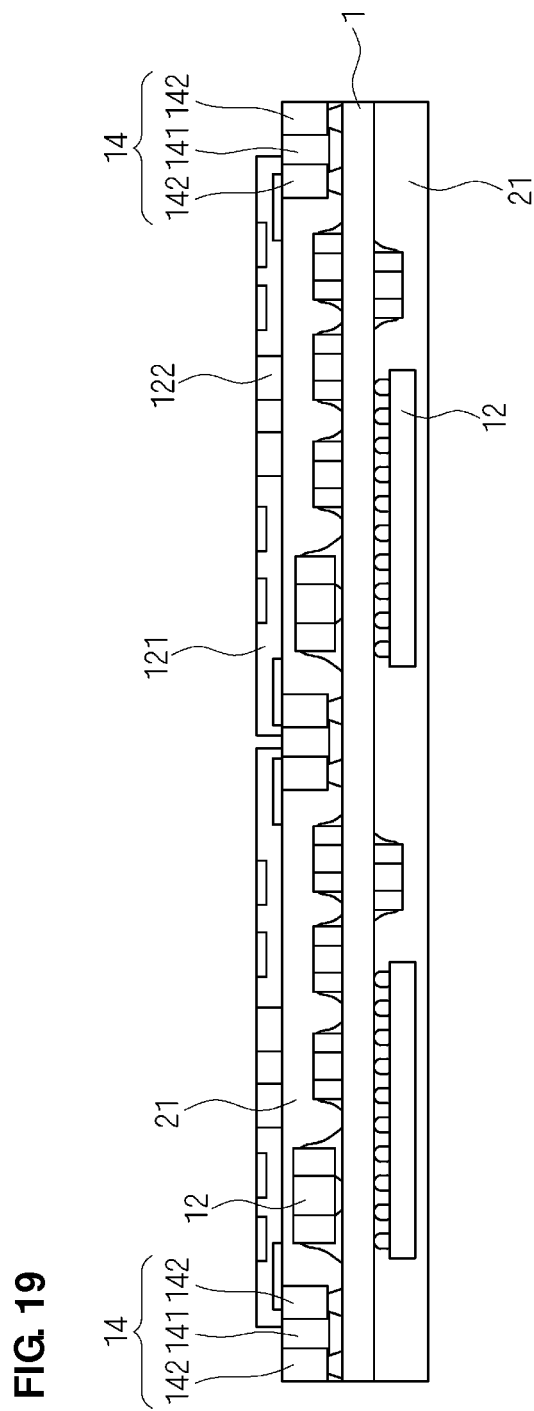
FIG. 19 is a cross-sectional view in a plane orthogonal to the direction in which the terminal connection substrates are arranged, in performing rewiring on the module substrate according to the fourth preferred embodiment of the present invention.

FIG. 19 is a cross-sectional view in a plane orthogonal to the direction in which the terminal connection substrates 14 are arranged, in performing rewiring on the module substrate according to the fourth preferred embodiment of the present invention. As illustrated in FIG. 19, the solder resist 121 is printed in the vicinity of the rewired pattern, and the plurality of bumps 122 is formed in accordance with the rewired pattern. Therefore, the locations of external electrodes are not limited to the locations of the plurality of terminal electrodes 142 (the neighborhood of an outer side of the module substrate), and the flexibility in design is improved.

Referring back to FIGS. 16A-16D, as illustrated in FIG. 16D, the composite substrate 1 with coplanarity achieved by grinding of the top surface of the sealing resin sheet 21 is divided into a plurality of module substrates using the dicer 11. Because the terminal connection substrate 14 is arranged so as to extend over the border between two neighboring module substrates, when the thickness of the blade of the dicer 11 is smaller than the width of the insulator 141, the insulator 141 is not fully removed and remains at the time of dividing. The module substrates in which the plurality of terminal electrodes 142 is not exposed on the peripheries can be manufactured.

Because the insulator 141 remains outside the plurality of terminal electrodes 142, the plurality of terminal electrodes 142 can be protected from oxidation and the like. Because the plurality of terminal electrodes 142 is not exposed on the peripheries, solder can be prevented from getting wet and spread over the peripheries of the module substrate, and insulation from an external shield can be reliably enabled.

As described above, according to the fourth preferred embodiment, a grinding step, a via-hole forming step, and the like are not necessary in the manufacturing steps, and the manufacturing cost can be greatly reduced. Because the insulators 141 in the terminal connection substrates 14 remain, the terminal electrodes 142 on the peripheries can be protected from oxidation or the like. Because the terminal electrodes 142 are not exposed on the peripheries, solder can be prevented from getting wet and spread over the peripheries of the module substrate, and insulation from an external shield can be reliably enabled.

The present invention is not limited to the above preferred embodiments and it will be apparent that various modifications, replacements, and the like are possible without departing from the scope of the present invention. For example, the insulator 141 in the terminal connection substrate 14 and the resin sheet 21 sealing the plurality of mounted electronic components 12 and terminal connection substrates 14 may have the same composition. In this case, adhesion between the sealing resin sheet 21 and the insulator 141 is increased, resistance to impacts occurring when the module substrate drops is improved, and reliability of the module substrate as a whole is improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A module substrate comprising:
   a base substrate;
   a plurality of electronic components mounted on at least a single side of the base substrate; and
   a plurality of terminal connection substrates each including an insulator and a plurality of columnar terminal electrodes arranged on the insulator; wherein
   the plurality of terminal connection substrates is mounted on the base substrate such that a single end side of each of the plurality of columnar terminal electrodes is in contact with the base substrate;
   the plurality of columnar terminal electrodes of each of the plurality of terminal connection substrates is disposed on two opposed outermost exposed lateral surfaces of the insulator so as to be spaced apart from one another along each of the two opposed outermost exposed lateral surfaces of the insulator;
   the plurality of columnar terminal electrodes extend outward from each of the two opposed outermost exposed lateral surfaces of the insulator; and
   the insulator extends along only an edge portion of the base substrate.

2. The module substrate according to claim 1, wherein the plurality of columnar terminal electrodes of the plurality of terminal connection substrates is arranged in a line on each of the two opposed outermost exposed lateral surfaces of the respective insulator.

3. The module substrate according to claim 1, wherein a resist is provided between the plurality of terminal electrodes in the terminal connection substrate.

4. The module substrate according to claim 1, wherein the plurality of electronic components and the plurality of terminal connection substrates mounted on the base substrate are sealed with resin, and the resin has an identical composition to that of the insulator.

5. A terminal connection substrate in which a plurality of columnar terminal electrodes is arranged on an insulator; wherein
   the plurality of columnar terminal electrodes is disposed on two opposed outermost exposed lateral surfaces of the insulator so as to be spaced apart from one another along each of the two opposed outermost exposed lateral surfaces of the insulator;
   the plurality of columnar terminal electrodes are disposed on and extend outward from each of the two opposed outermost exposed lateral surfaces of the insulator; and
   the insulator is configured to extend along only an edge portion of a base substrate.

* * * * *